US011804518B2

(12) United States Patent
Park et al.

(10) Patent No.: US 11,804,518 B2
(45) Date of Patent: Oct. 31, 2023

(54) SEMICONDUCTOR DEVICE AND METHOD OF MANUFACTURING THE SAME

(71) Applicant: Samsung Electronics Co., Ltd., Suwon-si (KR)

(72) Inventors: Jungmin Park, Seoul (KR); Haeryong Kim, Seongnam-si (KR); Young-geun Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/034,181

(22) Filed: Sep. 28, 2020

(65) Prior Publication Data

US 2021/0193457 A1   Jun. 24, 2021

(30) Foreign Application Priority Data

Dec. 24, 2019  (KR) .......................... 10-2019-0174171

(51) Int. Cl.
*H01L 21/762*  (2006.01)
*H10B 12/00*   (2023.01)
(Continued)

(52) U.S. Cl.
CPC .... *H01L 21/02197* (2013.01); *H01L 21/7624* (2013.01); *H01L 28/55* (2013.01);
(Continued)

(58) Field of Classification Search
CPC ............... C23C 16/40; H01L 21/02197; H01L 21/7624; H01L 27/108; H01L 27/10814;
(Continued)

(56) References Cited

U.S. PATENT DOCUMENTS 5,481,490 A    1/1996  Watanabe et al.
6,001,660 A *  12/1999 Park ................ H01L 21/76882
                                            257/E21.011
(Continued)

FOREIGN PATENT DOCUMENTS

JP    2000-269424 A    9/2000
JP    2001-077326 A    3/2001
(Continued)

OTHER PUBLICATIONS

Han Gyeol Lee, et al. "Atomic-Scale Metal-Insulator Transistion in SrRuO3 Ultrathin Films Triggered By Surface Termination Conversion," Advanced Materials vol. 32, pp. 1-9 (2020).
(Continued)

*Primary Examiner* — Andres Munoz
(74) *Attorney, Agent, or Firm* — Harness, Dickey & Pierce, P.L.C.

(57) ABSTRACT

A semiconductor device includes a capacitor including a lower electrode an upper electrode, and a dielectric layer between the lower electrode and the upper electrode. The lower electrode includes $ABO_3$ where 'A' is a first metal element and 'B' is a second metal element having a work function greater than that of the first metal element. The dielectric layer includes $CDO_3$ where 'C' is a third metal element and 'D' is a fourth metal element. The lower electrode includes a first layer and a second layer which are alternately and repeatedly stacked. The first layer includes the first metal element and oxygen. The second layer includes the second metal element and oxygen. The dielectric layer is in contact with the lower electrode at a first contact surface the first contact surface corresponding to the second layer.

18 Claims, 19 Drawing Sheets

(51) Int. Cl.
    *H01L 21/02* (2006.01)
    *H01L 49/02* (2006.01)
    *C23C 16/40* (2006.01)

(52) U.S. Cl.
    CPC ............ *H01L 28/65* (2013.01); *H10B 12/00* (2023.02); *C23C 16/40* (2013.01); *H01L 28/60* (2013.01); *H10B 12/0335* (2023.02); *H10B 12/315* (2023.02)

(58) Field of Classification Search
    CPC ......... H01L 27/10855; H01L 27/10885; H01L 28/55; H01L 28/60; H01L 28/75; H01L 28/65; H10B 12/00; H10B 12/0335; H10B 12/315; H10B 12/482
    See application file for complete search history.

(56) References Cited

U.S. PATENT DOCUMENTS

| | | | |
|---|---|---|---|
| 6,884,674 | B2 | 4/2005 | Tsuzumitani et al. |
| 10,074,505 | B2 | 9/2018 | Jacobs et al. |
| 2010/0019645 | A1* | 1/2010 | Lee .................. H01J 11/12 |
| | | | 313/307 |
| 2010/0068509 | A1 | 3/2010 | Ma et al. |
| 2017/0018604 | A1* | 1/2017 | Ahn .................. H01L 28/40 |
| 2017/0352666 | A1 | 12/2017 | Ahn et al. |
| 2019/0273012 | A1 | 9/2019 | Dagan et al. |

FOREIGN PATENT DOCUMENTS

| | | |
|---|---|---|
| JP | 2001-284542 A | 10/2001 |
| JP | 2003-264188 A | 9/2003 |
| WO | WO-2018/033916 A1 | 2/2018 |

OTHER PUBLICATIONS

Yeong Jae Shin, et al. "Interface Control of Ferroelectricity in an SrRuO3/BaTiO3/SrRuo3 Capacitor and its Critial Thickness," Advanced Materials, No. 1602795, pp. 1-6 (2017).

G. Herranz, et al. "SrRuo3/SrTiO3/SrRuO3 heterostructures for magnetic tunnel junctions," Journal of Applied Physics, vol. 93, No. 10, pp. 1-3 (2003).

* cited by examiner

SEMICONDUCTOR DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2019-0174171, filed on Dec. 24, 2019, in the Korean Intellectual Property Office, the disclosure of which is hereby incorporated by reference in its entirety.

BACKGROUND

Some example embodiments relate to a semiconductor and, more particularly, to a semiconductor device and/or a method of manufacturing the same.

Semiconductor devices are widely used in an electronic industry because of their small sizes, multi-functional characteristics, and/or low manufacturing costs. Semiconductor devices have been highly integrated with the development of the electronic industry. Widths of patterns included in semiconductor devices have been reduced to increase the integration density of semiconductor devices. In particular, as a design rule of a semiconductor memory device such as dynamic random access memory (DRAM) is being reduced, a range of capacitance, e.g. a standard deviation and/or an inter-quartile range and/or a difference between a maximum value and a minimum value of a capacitance, may be increased by oxidation of a lower electrode of a capacitor. Thus, there is desire for a structure of a semiconductor memory device and a method which are capable of reducing the difference of the capacitance.

SUMMARY

Some example embodiments of inventive concepts may provide a semiconductor device capable of reducing a leakage current of a capacitor and/or a method of manufacturing the same.

Alternatively or additionally, some example embodiments of inventive concepts may also provide a semiconductor device capable of improving reliability and/or a method of manufacturing the same.

According to some example embodiments, a semiconductor device may include a capacitor including a lower electrode an upper electrode, and a dielectric layer between the lower electrode and the upper electrode. The lower electrode includes $ABO_3$ where 'A' is a first metal element and 'B' is a second metal element having a work function greater than that of the first metal element. The dielectric layer includes $CDO_3$ where 'C' is a third metal element and 'D' is a fourth metal element. The lower electrode includes a first layer and a second layer which are alternately and repeatedly stacked. The first layer includes the first metal element and oxygen. The second layer includes the second metal element and oxygen. The dielectric layer is in contact with the lower electrode at a first contact surface the first contact surface corresponding to the second layer.

According to some example embodiments, a semiconductor device may include a capacitor including a lower electrode, an upper electrode, and a dielectric layer between the lower electrode and the upper electrode. The lower electrode includes a first metal element, a second metal element, and oxygen. The dielectric layer includes a third metal element, a fourth metal element, and oxygen. The lower electrode includes a first layer and a second layer which are alternately and repeatedly stacked; the first layer includes the first metal element and oxygen. The second layer includes the second metal element and oxygen. The first metal element is at least one of Sr, Ba, La, or Ca, and the second metal element is at least one of Ru, Mo, Jr, Co, or Ni. The dielectric layer contacts the lower electrode at a first contact surface, the first contact surface corresponding to the second layer.

According to some example embodiments, a semiconductor device may include a first conductive line buried in an upper portion of a substrate, the first conductive line extending in a first direction, an active portion in the upper portion of the substrate, the active portion defined by a device isolation pattern, the active portion including a first dopant region and a second dopant region which are separated from each other with the first conductive line interposed between the first dopant region and the second dopant region, a second conductive line on the substrate, the second conductive line extending in a second direction intersecting the first direction, the second conductive line connected to the first dopant region, a contact connected to the second dopant region, and a capacitor connected to the second dopant region through the contact. The capacitor includes a lower electrode, an upper electrode, and a dielectric layer between the lower electrode and the upper electrode. The lower electrode includes $ABO_3$ where 'A' is a first metal element and 'B' is a second metal element having a work function greater than that of the first metal element, the dielectric layer includes $CDO_3$ where 'C' is a third metal element and 'D' is a fourth metal element. The lower electrode includes a first layer and a second layer which are alternately and repeatedly stacked, the first layer includes the first metal element and oxygen the second layer includes the second metal element and oxygen. The dielectric layer contacts the lower electrode at a first contact surface of the lower electrode, the first surface corresponding to the second layer.

According to some example embodiments, a method of manufacturing a semiconductor device may include forming a lower electrode on a substrate, forming a dielectric layer on the lower electrode; and forming an upper electrode on the dielectric layer. The forming of the lower electrode comprises performing a lower electrode-forming cycle a plurality of times, and the lower electrode-forming cycle comprises a process of depositing a first layer and a process of depositing a second layer. The process of depositing the first layer includes supplying a first metal element source, and supplying an oxygen source. The process of depositing the second layer includes supplying a second metal element source, and supplying the oxygen source. The process of depositing the second layer ends the forming of the lower electrode.

BRIEF DESCRIPTION OF THE DRAWINGS

Example embodiments will become more apparent in view of the attached drawings and accompanying detailed description.

DETAILED DESCRIPTION OF EXAMPLE EMBODIMENTS

A semiconductor device and a method of manufacturing the same according to some example embodiments of inventive concepts will be described hereinafter in detail with reference to the accompanying drawings.

Figure 1:
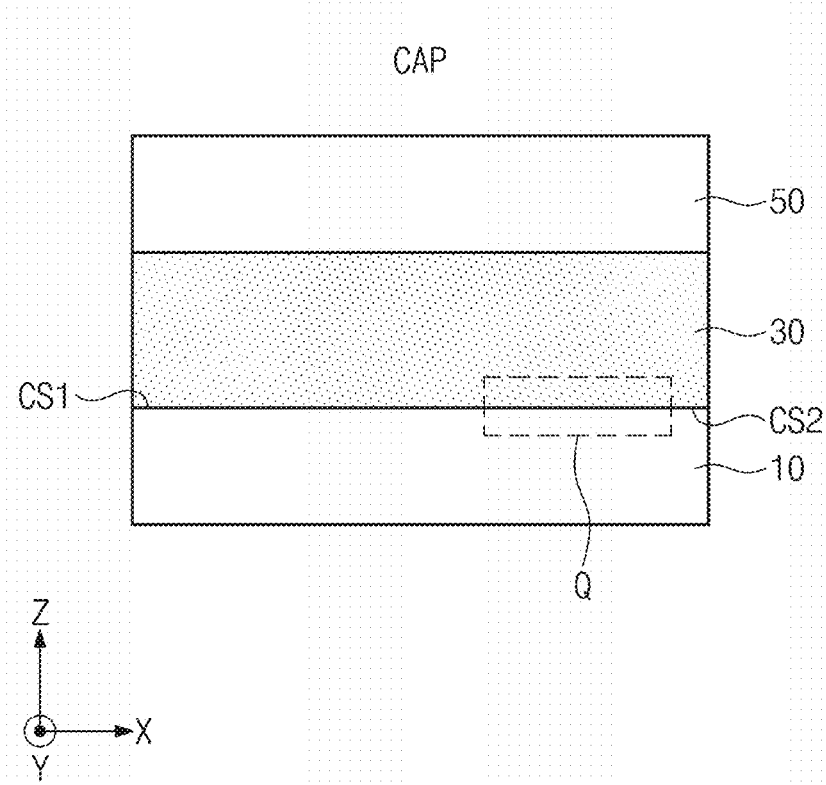
FIG. 1 is a cross-sectional view illustrating a capacitor according to some example embodiments of inventive concepts.
Figure 2:
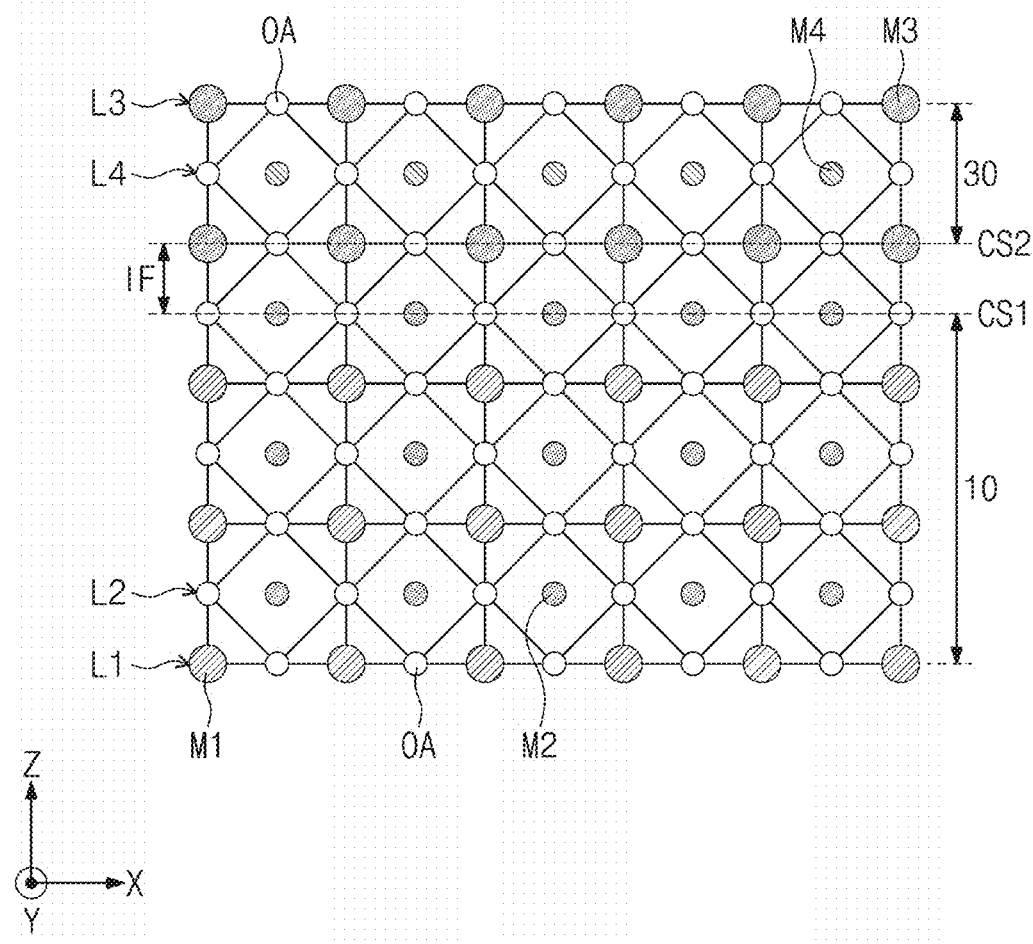
FIG. 2 is an enlarged view of a region 'Q' of FIG. 1.
Figure 3:
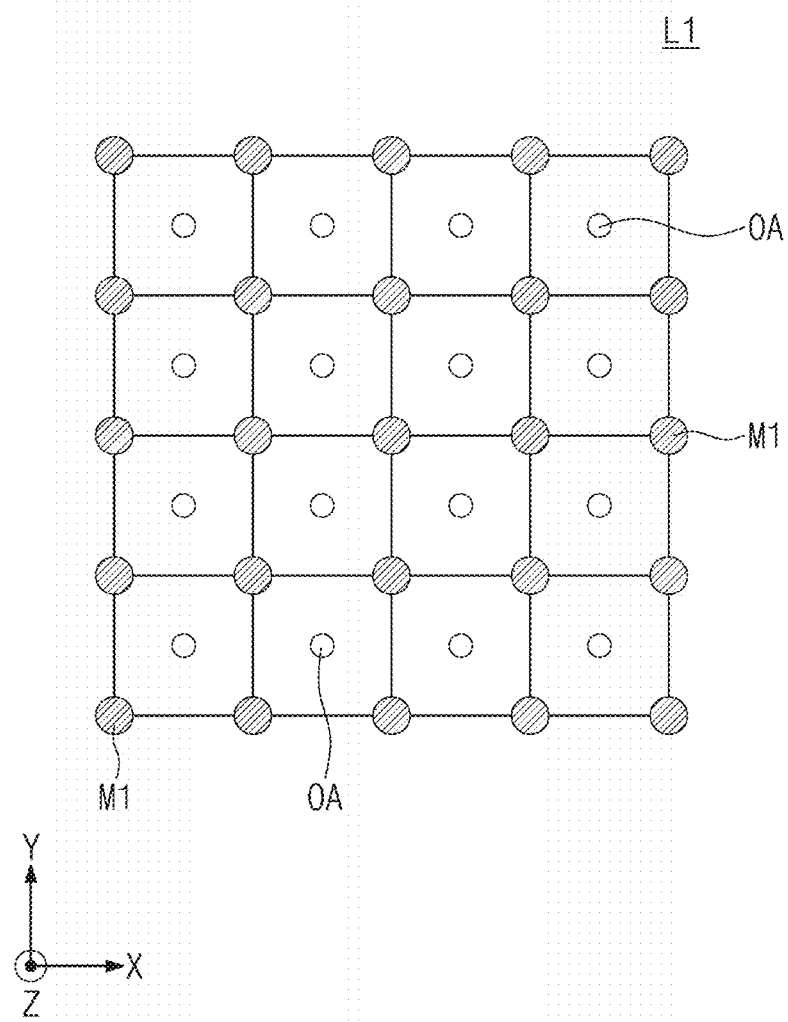
FIG. 3 is a plan view of a first layer.
Figure 4:
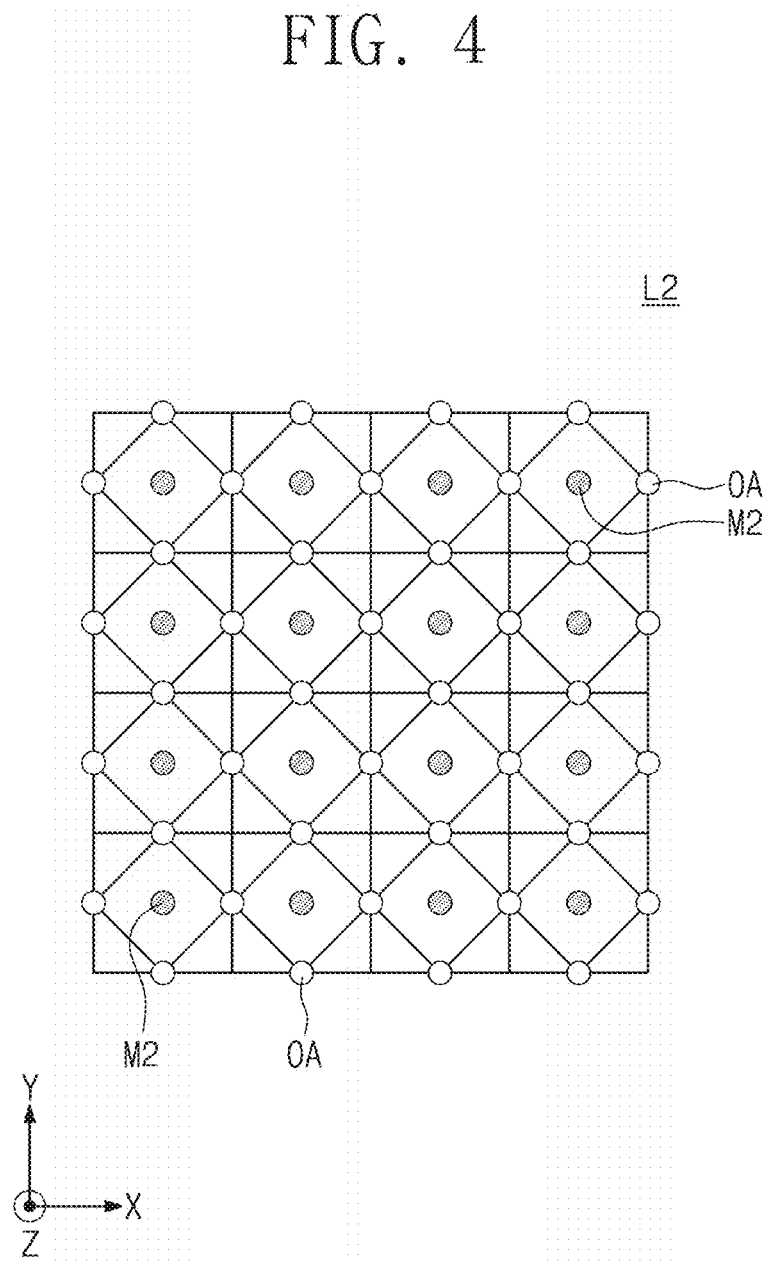
FIG. 4 is a plan view of a second layer.
Figure 5:
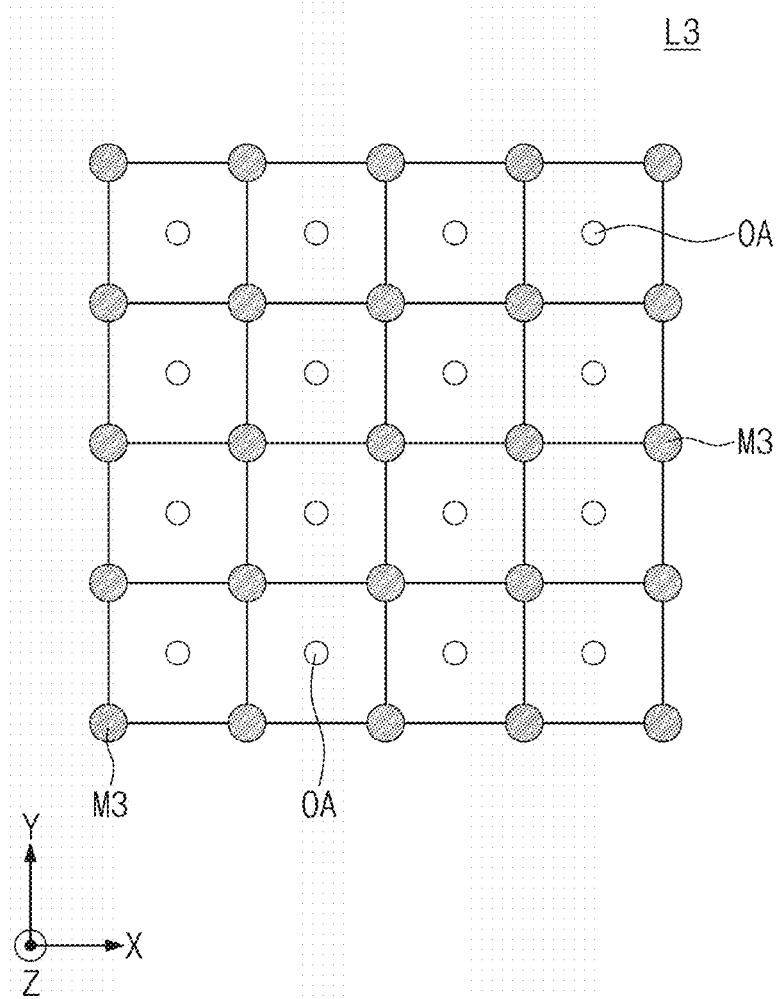
FIG. 5 is a plan view of a third layer.
Figure 6:
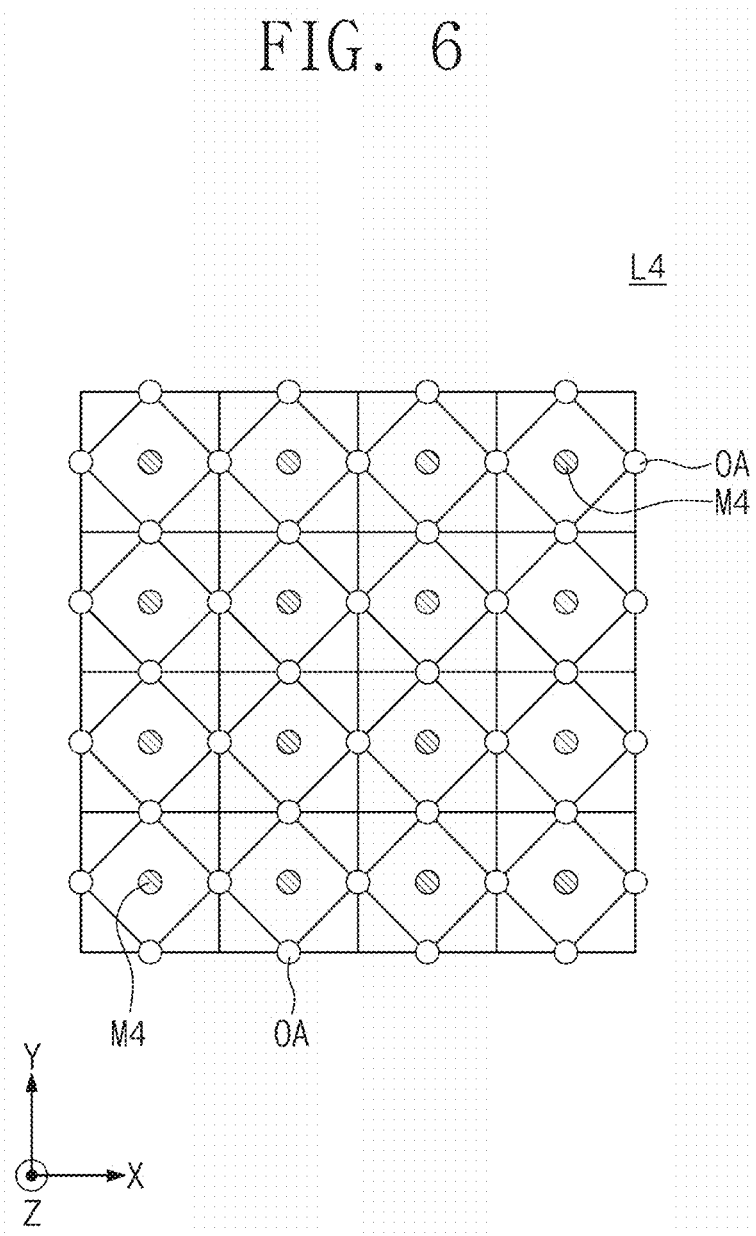
FIG. 6 is a plan view of a fourth layer.

FIG. 1 is a cross-sectional view illustrating a capacitor according to some example embodiments of inventive concepts. FIG. 2 is an enlarged view of a region 'Q' of FIG. 1. FIG. 3 is a plan view of a first layer. FIG. 4 is a plan view of a second layer. FIG. 5 is a plan view of a third layer. FIG. 6 is a plan view of a fourth layer.

Referring to FIGS. 1 and 2, a capacitor CAP may include a lower electrode 10, an upper electrode 50, and a dielectric layer 30 between the lower and upper electrodes 10 and 50. The upper electrode 50 may be spaced apart from the lower electrode 10 in a Z direction. For example, the capacitor CAP may be provided on a substrate (not illustrated), the lower electrode 10 may be adjacent to the substrate, and the upper electrode 50 may be spaced apart from the substrate with the lower electrode 10 interposed therebetween. For example, the lower electrode 10, the dielectric layer 30 and the upper electrode 50 may be sequentially stacked on the substrate in the Z direction. As used herein, the X direction, the Y direction, and the Z direction may correspond to different directions relative to one another, and use of the X direction, the Y direction, and the Z direction does not necessarily indicate a relation to a ground, e.g. to a flat surface relative to the earth. For example, the Z direction may extend in a direction perpendicular to, or parallel to, a flat surface relative to the earth. As another example, the lower electrode 10 may be conformal to another surface, such as to a base electrode.

Referring to FIG. 2, the lower electrode 10 may include a first compound including a first metal element M1, a second metal element M2, and at least one oxygen atom OA. For example, the lower electrode 10 may be a ternary compound expressed by a chemical formula of $ABO_3$. Here, 'A' may correspond to the first metal element M1, and 'B' may correspond to the second metal element M2. The first compound may have a perovskite crystal structure, for example a structure having two cations of different sizes (e.g. 'A' and 'B', along with an anion (e.g. $O_3$). For example, the first metal element M1 may be disposed at each of eight corners of a unit cell, and the second metal element M2 may be disposed at a center of the unit cell. The oxygen atom OA may be disposed at each of centers of six faces of the unit cell. A ratio of the first metal element M1:the second metal element M2:the oxygen atom OA may be 1:1:3 in the unit cell. The lower electrode 10 may have a ferromagnetic property. A thickness of the lower electrode 10 may range from about 50 Å (5 nm) to about 100 Å (10 nm).

The lower electrode 10 may include atomic layers such as a first layer L1 and a second layer L2 which are alternately and repeatedly stacked in the Z direction. As illustrated in FIG. 3, the first layer L1 may be parallel to an XY plane and may be formed of the first metal element M1 and the oxygen atom OA. The first layer L1 may correspond to a {100} plane of the lower electrode 10. The first metal element M1 may be disposed at each of lattice points, and the oxygen atom OA may be disposed at a center of a face of the unit cell which is formed by four first metal elements M1. A ratio of the first metal element M1 to the oxygen atom OA in the first layer L1 may be 1:1.

As illustrated in FIG. 4, the second layer L2 may be parallel to the XY plane and may be formed of the second metal element M2 and the oxygen atom OA. The second layer L2 may correspond to the {100} plane of the lower electrode 10. The second metal element M2 may be disposed at the center of the unit cell. The oxygen atom OA may be disposed at each of the centers of the faces included in/constituting/corresponding to the unit cell (or at each of centers of edges of the unit cell in a plan view). A ratio of the second metal element M2 to the oxygen atom OA in the second layer L2 may be 1:2.

A work function of the second metal element M2 may be greater than that of the first metal element M1. For example, the work function of the first metal element M1 may be less than 4 eV. The work function of the second metal element M2 may be greater than 4.5 eV and less than 6 eV. For example, the first metal element M1 may be at least one of Sr, Ba, La, or Ca. The second metal element M2 may be at least one of Ru, Mo, Jr, Co, or Ni. For example, the first compound may be, but not limited to, $SrRuO_3$, $SrCoO_3$, $SrMoO_3$, $CaRuO_3$, $BaRuO_3$, or $(Ba, Sr)RuO_3$.

The dielectric layer 30 may include a second compound including a third metal element M3, a fourth metal element M4, and an oxygen atom OA. For example, the dielectric layer 30 may be or include a ternary compound expressed by a chemical formula of $CDO_3$. Here, 'C' may correspond to the third metal element M3, and 'D' may correspond to the fourth metal element M4. The second compound may have the perovskite crystal structure. For example, the third metal element M3 may be disposed at each of eight corners of a unit cell, and the fourth metal element M4 may be disposed at a center of the unit cell. The oxygen atom OA may be disposed at each of centers of six faces of the unit cell. A ratio of the third metal element M3:the fourth metal element M4:the oxygen atom OA may be 1:1:3 in the unit cell. The dielectric layer 30 may have a paraelectric and/or a ferroelectric property. A thickness of the dielectric layer 30 may range from about 50 Å (5 nm) to about 100 Å (10 nm).

The dielectric layer 30 may include a third layer L3 and a fourth layer L4 which are alternately and repeatedly stacked in the Z direction. As illustrated in FIG. 5, the third layer L3 may be parallel to the XY plane and may be formed of the third metal element M3 and the oxygen atom OA. The third layer L3 may correspond to a {100} plane of the dielectric layer 30. The third metal element M3 may be disposed at each of lattice points, e.g. each of lattice points of a unit cell, and the oxygen atom OA may be disposed at a center of a face of the unit cell which is formed by four third metal elements M3. A ratio of the third metal element M3 to the oxygen atom OA in the third layer L3 may be 1:1.

As illustrated in FIG. 6, the fourth layer L4 may be parallel to the XY plane and may be formed of the fourth metal element M4 and the oxygen atom OA. The fourth layer L4 may correspond to the {100} plane of the dielectric layer 30. The fourth metal element M4 may be disposed at the center of the unit cell. The oxygen atom OA may be disposed at each of the centers of the faces included in/constituting/corresponding to the unit cell (or at each of centers of edges of the unit cell in a plan view). A ratio of the fourth metal element M4 to the oxygen atom OA in the fourth layer L4 may be 1:2.

A work function of the fourth metal element M4 may be greater than that of the third metal element M3. For example, the work function of the third metal element M3 may be less than 4 eV. The work function of the fourth metal element M4 may be greater than 4.0 eV and less than 4.5 eV. For example, the third metal element M3 may be at least one of Ba, Sr, or Ca. The fourth metal element M4 may be at least one of Ti, Zr, or Hf. For example, the second compound may be, but not limited to, $BaTiO_3$, $(Ba,Sr)TiO_3$ (BST), $SrTiO_3$, $(Ba,Sr)(Zr,Ti)O_3$ (BSZTO), $Sr(Zr,Ti)O_3$ (SZTO), $Ba(Zr,Ti)O_3$ (BZTO), $(Ba,Sr)ZrO_3$ (BSZO), $SrZrO_3$, or $BaZrO_3$. Alternatively or additionally, the third metal element M3 may be an element (e.g., Pb) of which a work function is greater than 4 eV and less than that of the fourth metal element M4. In this case, the second compound may be or include $Pb(Zr,Ti)O_3$ (PZT) or $(Pb,La)(Zr,Ti)O_3$ (PLZT).

A work function of the fourth layer L4 corresponding to an oxide layer of the fourth metal element M4 may be greater than a work function of the third layer L3 corresponding to an oxide layer of the third metal element M3. For example, when the fourth layer L4 is $TiO_2$ and the third layer L3 is SrO, the work function (about 6.33 eV) of the fourth layer L4 may be greater than the work function (about 3.18 eV) of the third layer L3. For example, the work function of the fourth layer L4 may range from about 5.0 eV to about 6.5 eV.

The upper electrode 50 may include a metal layer including at least one of a noble metal (e.g., Pt, Jr, or Ru), Ti, or W. In some example embodiments, the upper electrode 50 may be formed of the same ternary compound as the lower electrode 10. In some example embodiments, the upper electrode 50 may include a heterogeneous semiconductor material such as silicon-germanium.

An interface IF may exist between the lower electrode 10 and the dielectric layer 30. The interface IF may be or correspond to a region in which a first contact surface CS1 corresponding to a top surface of the lower electrode 10 is in contact, e.g. in direct and/or atomic contact, with a second contact surface CS2 corresponding to a bottom surface of the dielectric layer 30. The first contact surface CS1 and the second contact surface CS2 may be spaced apart from each other in terms of a lattice but may be in contact with each other in terms of a macro scale.

The first contact surface CS1 of the lower electrode 10 may be the {100} plane. The first contact surface CS1 may be one of the first and second layers L1 and L2 having the greater work function. As illustrated in FIG. 2, the first contact surface CS1 may be or correspond to the second layer L2. The second layer L2 may consist of (or consist essentially of, or include) the second metal element M2 and the oxygen atom OA and may be expressed by $BO_2$. The first layer L1 may consist of (or consist essentially of, or include) the first metal element M1 and the oxygen atom OA and may be expressed by AO. A work function of an oxide (e.g., $BO_2$) of the second metal element M2 may be greater than that of an oxide (e.g., AO) of the first metal element M1.

For example, a work function of the second layer L2 corresponding to an oxide layer of the second metal element M2 may be greater than a work function of the first layer L1 corresponding to an oxide layer of the first metal element M1. For example, when the second layer L2 is $RuO_2$ and the first layer L1 is SrO, the work function (about 5.16 eV) of the second layer L2 may be greater than the work function (about 2.55 eV) of the first layer L1. The second contact surface CS2 of the dielectric layer 30 may be one, having a small work function, of the third and fourth layers L3 and L4. For example, the second contact surface CS2 may be or correspond to the third layer L3.

Figure 7:
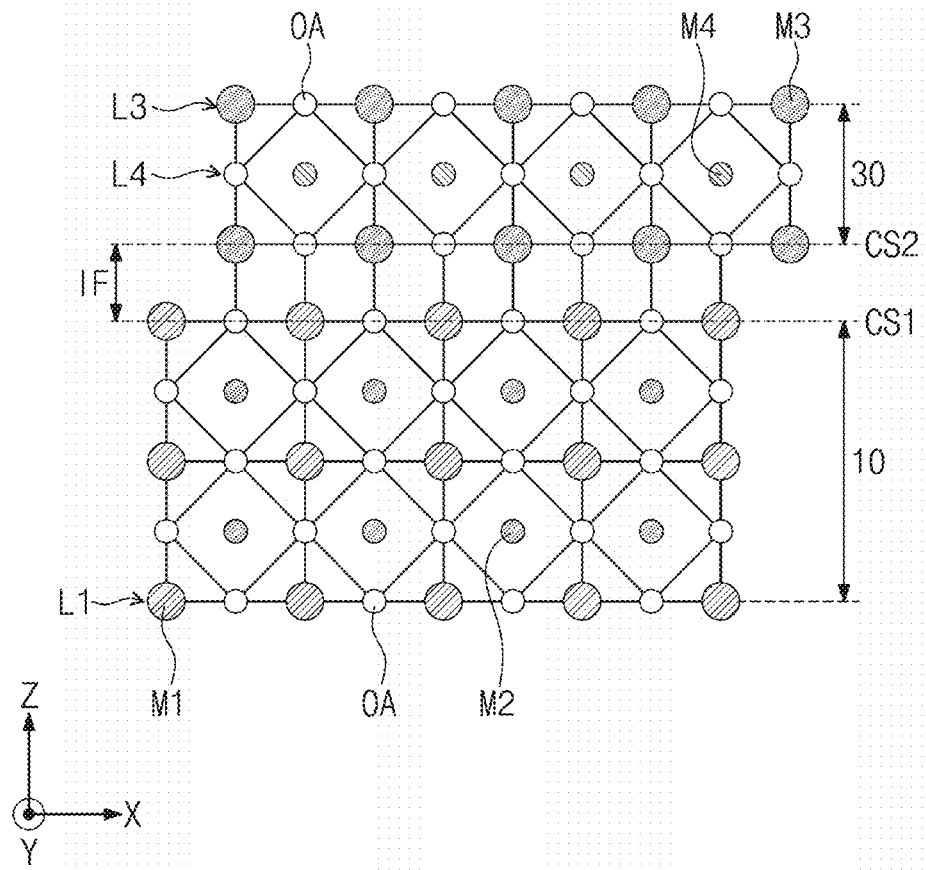
FIG. 7 is a conceptual view illustrating an interface between a lower electrode and a dielectric layer according to a comparative example.

FIG. 7 is a conceptual view illustrating an interface between a lower electrode and a dielectric layer according to a comparative example. Referring to FIG. 7, a first contact surface CS1 of a lower electrode 10 may be or correspond to the first layer L1 in the comparative example.

When the dielectric layer 30 is formed of the ternary compound having the perovskite crystal structure, a dielectric constant of the dielectric layer 30 may be increased as compared with a binary compound such as $ZrO_2$. As a result, a capacitance of the capacitor may be increased. If the lower electrode 10 is formed of a binary compound, crystallinity of the dielectric layer 30 may be reduced by lattice mismatch between the lower electrode 10 and the dielectric layer 30 formed of the ternary compound, and thus a dielectric constant of the dielectric layer 30 may be deteriorated. A work function of a ternary compound dielectric layer may be less than that of a binary compound dielectric layer, and thus a conduction band offset (CBO) value between the ternary compound dielectric layer and a lower electrode may be less than about 1.0 eV. Thus, a leakage current of a capacitor may be increased. However, according to the some example embodiments of inventive concepts, the first contact surface CS1 of the lower electrode 10 may be the second layer L2 of which the work function is greater than that of the first layer L1, and thus a CBO value may be increased to about 2.0 eV or more. As a result, a leakage current of the capacitor according to the some example embodiments of inventive concepts may be reduced as compared with the case in which the first contact surface CS1 is the first layer L1 like the comparative example of FIG. 7, and thus the reliability of the semiconductor device may be improved.

Figure 8:
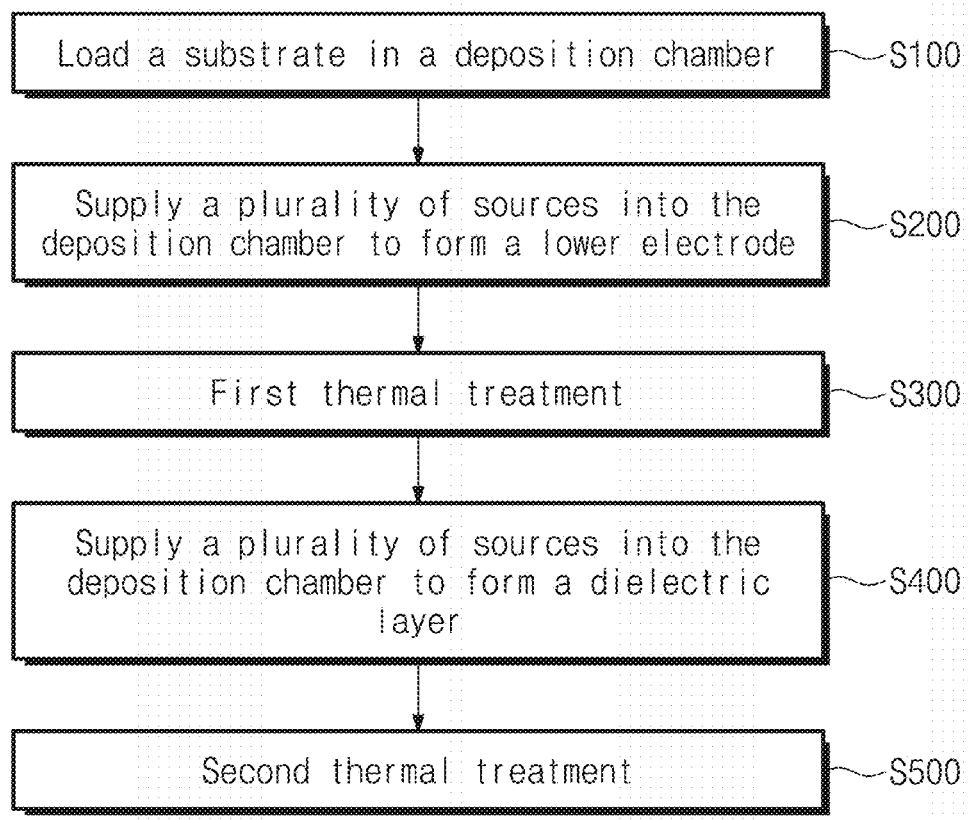
FIG. 8 is a process flowchart illustrating a method of forming a capacitor, according to some example embodiments of inventive concepts.
Figure 9:
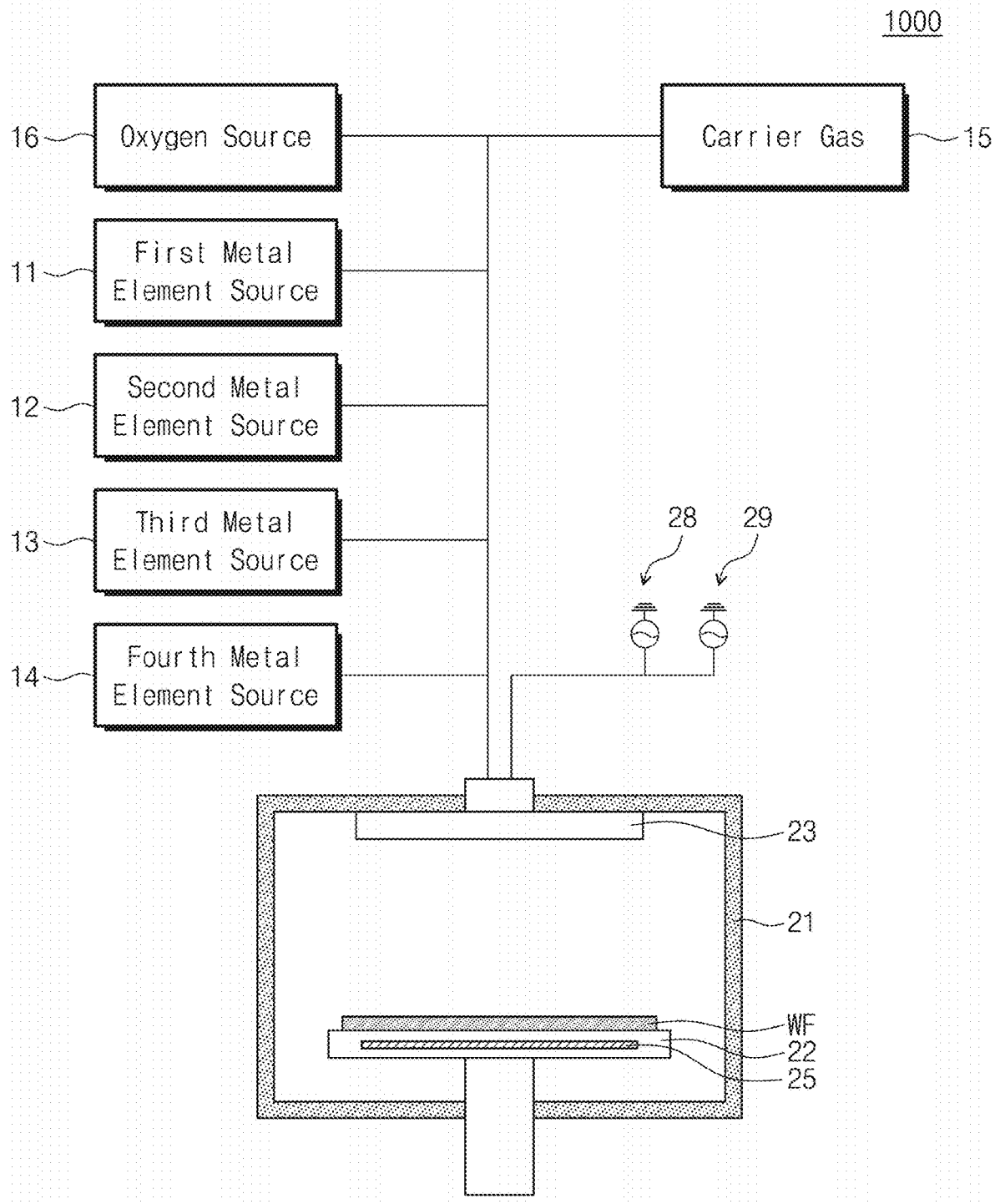
FIG. 9 is a conceptual view illustrating a deposition apparatus for forming layers according to some example embodiments of inventive concepts.
Figure 10:
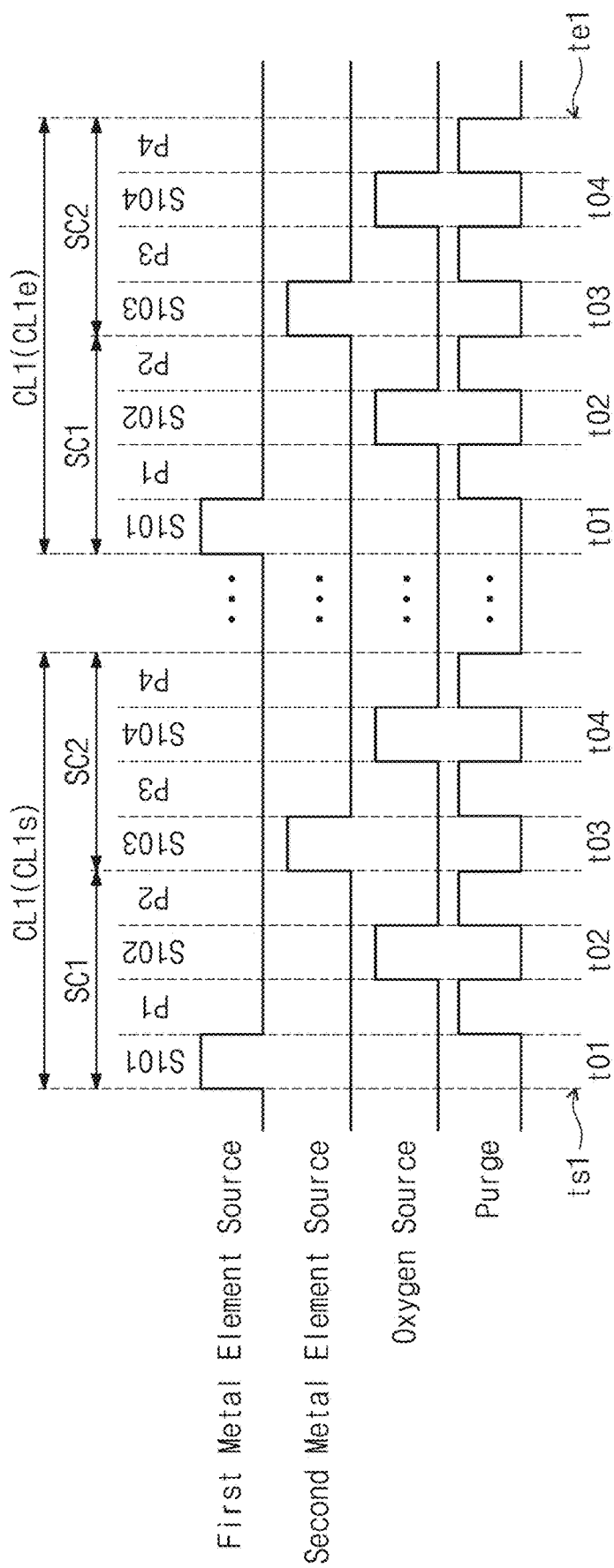
FIG. 10 is a timing diagram illustrating a supply cycle of process gases for forming a lower electrode according to some example embodiments of inventive concepts.
Figure 11:
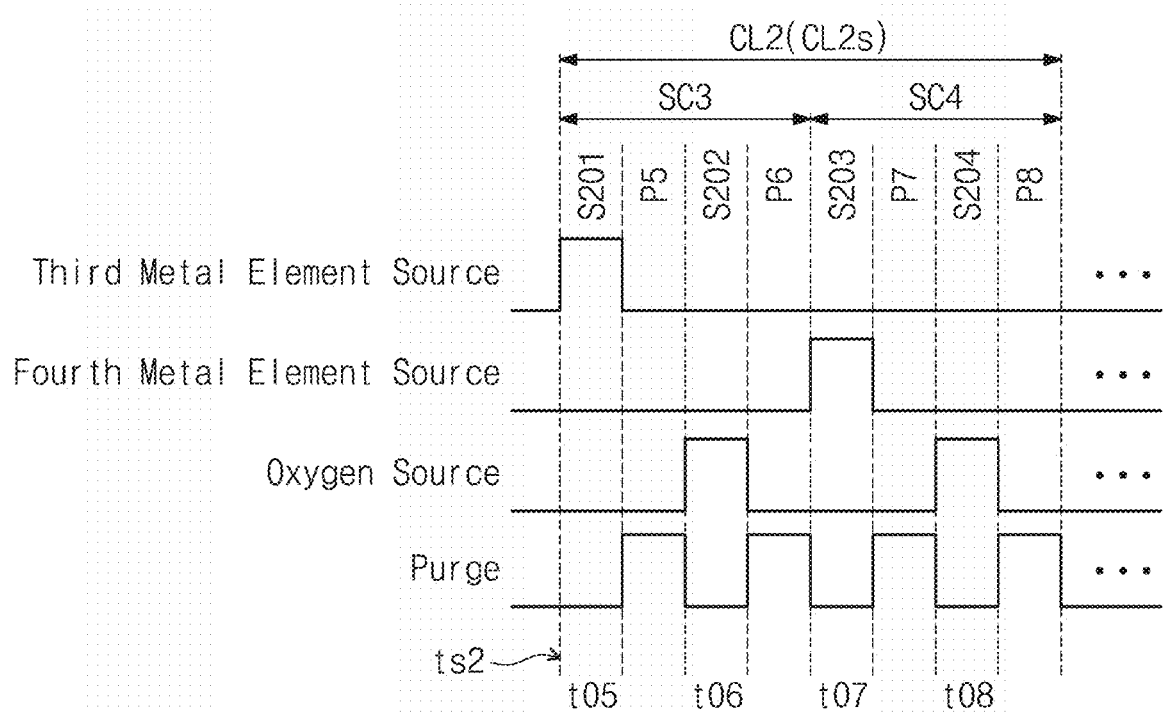
FIG. 11 is a timing diagram illustrating a supply cycle of process gases for forming a dielectric layer according to some example embodiments of inventive concepts.

FIG. 8 is a process flowchart illustrating a method of forming a capacitor, according to some example embodiments of inventive concepts. FIG. 9 is a conceptual view illustrating a deposition apparatus for forming layers according to some example embodiments of inventive concepts. FIG. 10 is a timing diagram illustrating a supply cycle of process gases for forming a lower electrode according to some example embodiments of inventive concepts. FIG. 11 is a timing diagram illustrating a supply cycle of process gases for forming a dielectric layer according to some example embodiments of inventive concepts.

Referring to FIGS. 8 and 9, a deposition apparatus 1000 may include a deposition chamber 21. For example, the deposition apparatus 1000 may be or include an atomic layer deposition (ALD) apparatus. The deposition apparatus 1000 may also include a chuck/platen/stage 22 which is provided in the deposition chamber 21 and upon which a substrate WF is loaded, and a shower head 23 which is used to supply gases such as reaction gases into the deposition chamber 21. The stage 22 may include a heater 25 therein to maintain the substrate WF at a desired and/or specific temperature. High radio frequency (HRF) power 28 of 13.56 MHz and/or 27

MHz may be applied to the shower head 23 (and/or a top electrode connected to the shower head 23) and the stage 22 may be grounded, and thus plasma may be formed between the shower head 23 and the stage 22. In some example embodiments, when the plasma is formed, low radio frequency (LRF) power 29 of 5 MHz or less (e.g., 400 kHz to 500 kHz) may be additionally applied to the shower head 23 and/or the top electrode as desired/needed.

Process gases may be supplied into the deposition chamber 21 through the shower head 23. In some example embodiments, the shower head 23 may be connected to a first metal element source 11, a second metal element source 12, a third metal element source 13, a fourth metal element source 14, and an oxygen source 16 through one or more of supply lines. A carrier gas supply unit 15 may be connected to the shower head 23. The first metal element source 11, the second metal element source 12, the third metal element source 13, the fourth metal element source 14 and the oxygen source 16 may be supplied to the shower head 23 through individual supply lines separated from each other. Alternatively, at least portions of the individual supply lines may overlap, e.g. be common, with each other. The first to fourth metal element sources 11, 12, 13 and 14 may be or include sources of different elements from each other. Alternatively, when kinds of at least some of the first to fourth metal elements described above are the same as each other, at least some of the first to fourth metal element sources 11, 12, 13 and 14 may be sources of substantially the same element. For example, when the first metal element M1 is the same as the third metal element M3, the first metal element source 11 and the third metal element source 13 may be substantially the same source.

A carrier gas supplied from the carrier gas supply unit 15 may carry another source and/or a precursor into the deposition chamber 21. The carrier gas may enable purging of an unreacted material and/or reaction byproducts in the deposition chamber 21 to the outside of the deposition chamber 21 through the use of a vacuum pump. The carrier gas may be or include an inert gas such as helium (He) or neon (Ne) and/or may be a gas having very low reactivity, such as nitrogen ($N_2$) or carbon dioxide ($CO_2$). However, example embodiments of inventive concepts are not limited thereto. At least a portion of a supply line of the carrier gas supply unit 15 may overlap with the supply lines of the first metal element source 11, the second metal element source 12, the third metal element source 13, the fourth metal element source 14 and the oxygen source 16. Alternatively, the supply line of the carrier gas supply unit 15 may be separated from the supply lines of the first metal element source 11, the second metal element source 12, the third metal element source 13, the fourth metal element source 14 and the oxygen source 16.

A substrate WF may be loaded on the stage 22 in the deposition chamber 21 (S100). The substrate WF may be a wafer, such as a 200 mm or 300 mm diameter wafer. A plurality of sources may be supplied into the deposition chamber 21 to form a lower electrode on the substrate WF (S200). The process of forming the lower electrode may be completed after the lower electrode is formed to have a specific and/or desired thickness, and then, a first thermal treatment process may be performed (S300). The process of forming the lower electrode will be described hereinafter in more detail.

Referring to FIGS. 1 to 4 and 8 to 10, the lower electrode 10 may be formed on the substrate WF (e.g., the wafer) (S200). The formation of the lower electrode 10 may be performed like and/or according to the timing diagram of FIG. 10. The formation of the lower electrode 10 may include a plurality of first cycles CL1. The first cycle CL1 may include a process SC1 of forming the first layer L1 (hereinafter, referred to as a first process SC1) and a process SC2 of forming the second layer L2 (hereinafter, referred to as a second process SC2).

The first process SC1 may include a process S101 of supplying the first metal element source 11, a first purge process P1, a first supplying process S102 of the oxygen source 16, and a second purge process P2, which are sequentially performed. The first layer L1 which consists of (or consists essentially of, or includes) the first metal element M1 (such as in a gaseous-phase) and the oxygen atom OA and substantially corresponds to an (atomic) monolayer may be formed by the first process SC1. As disclosed herein, a monolayer may mean a layer having a structure in which atoms are two-dimensionally arranged. The second process SC2 may include a process S103 of supplying the second metal element source 12, a third purge process P3, a second supplying process S104 of the oxygen source 16, and a fourth purge process P4, which are sequentially performed. The second layer L2 which consists of (or consists essentially of, or includes) the second metal element M2 and the oxygen atom OA and substantially corresponds to an (atomic) monolayer may be formed by the second process SC2. A source gas not reacting with the wafer in the process immediately before each of the first to fourth purge processes P1, P2, P3 and P4 may be exhausted to the outside of the deposition chamber 21 by each of or at least some of the first to fourth purge processes P1, P2, P3 and P4. The first cycle CL1 may be performed a plurality of times to form the lower electrode 10 in which the first layer L1 and the second layer L2 are alternately and repeatedly stacked.

The first metal element source 11 may include at least one of Sr, Ba, La, or Ca. For example, the first metal element source 11 may be a strontium (Sr) source. The strontium source may include a cyclopenta-based ligand and/or a ketoimine-based ligand. The second metal element source 12 may include at least one of Ru, Mo, Jr, Co, or Ni. For example, the second metal element source 12 may be a ruthenium (Ru) source. The ruthenium source may include a β-diketonate-based ligand. For example, the oxygen source 16 may include $O_2$ and/or $O_3$.

In the first process SC1, the process S101 of supplying the first metal element source 11 may be performed for a time t01. For example, the time t01 may range from about 7 seconds to about 15 seconds. In the second process SC2, the process S103 of supplying the second metal element source 12 may be performed for a time t03. For example, the time t03 may range from about 3 seconds to about 7 seconds. For example, the process S101 of supplying the first metal element source 11 may be longer than the process S103 of supplying the second metal element source 12. Each of the first to fourth purge processes P1, P2, P3 and P4 may be performed for a time of about 15 seconds to about 25 seconds. The first supplying process S102 of the oxygen source 16 may be performed for a time t02. For example, the time t02 may range from about 15 seconds to about 25 seconds. The second supplying process S104 of the oxygen source 16 may be performed for a time t04. For example, the time t04 may range from about 15 seconds to about 25 seconds. During the first cycle CL1 for forming the lower electrode 10, a chamber temperature may be maintained at a temperature of about 300 degrees Celsius to about 500 degrees Celsius. During the first cycle CL1 for forming the lower electrode 10, a pressure in the chamber may range from about 1 Torr (133 Pascal) to about 3 Torr (400 Pascal).

The formation of the lower electrode 10 may be started at a start point ts1 of an initial first cycle CL1s and may be ended at an end point te1 of the last first cycle CL1e. The initial first cycle CL1s including the start point ts1 is started from the first process SC1 of the first and second processes SC1 and SC2 in FIG. 10. Alternatively, the initial first cycle CL1s may be started from the second process SC2. In the last first cycle CL1e including the end point te1, a last supplied metal element source may be the second metal element source 12. For example, the last first cycle CL1e may be ended by the second process SC2 of the first and second processes SC1 and SC2. As a result, the first contact surface CS1 of the lower electrode 10 described with reference to FIGS. 1 and 2 may be or correspond to the second layer L2.

After the end point te1, the first thermal treatment process (S300) may be performed. The first thermal treatment process (S300) may be performed in-situ in the deposition chamber 21. However, some example embodiments of inventive concepts are not limited thereto; for example, the substrate WF may be thermally treated in another chamber. The metal element sources may not be supplied during the first thermal treatment process (S300). The first thermal treatment process (S300) may be performed at a temperature of about 300 degrees Celsius to about 600 degrees Celsius. A crystallinity of the lower electrode 10 may be increased by the first thermal treatment process (S300).

The dielectric layer 30 may be formed on the lower electrode 10 (S400). The formation of the dielectric layer 30 may be performed like or in a manner corresponding to the timing diagram of FIG. 11. The formation of the dielectric layer 30 may include a plurality of second cycles CL2. The second cycle CL2 may include a process SC3 of forming the third layer L3 (hereinafter, referred to as a third process SC3) and a process SC4 of forming the fourth layer L4 (hereinafter, referred to as a fourth process SC4).

The third process SC3 may include a process S201 of supplying the third metal element source 13, a fifth purge process P5, a third supplying process S202 of the oxygen source 16, and a sixth purge process P6, which are sequentially performed. The third layer L3 which consists of (or consists essentially of, or includes) the third metal element M3 and the oxygen atom OA and substantially corresponds to a monolayer may be formed by the third process SC3. The fourth process SC4 may include a process S203 of supplying the fourth metal element source 14, a seventh purge process P7, a fourth supplying process S204 of the oxygen source 16, and an eighth purge process P8, which are sequentially performed. The fourth layer L4 which consists of (or consists essentially of, or includes) the fourth metal element M4 and the oxygen atom OA and corresponds to substantially a monolayer may be formed by the fourth process SC4. The second cycle CL2 may be performed a plurality of times to form the dielectric layer 30 in which the third layer L3 and the fourth layer L4 are alternately and repeatedly stacked. The third metal element source 13 may include at least one of Sr, Ba, La, or Ca. The fourth metal element source 14 may include at least one of Ti, Zr, or Hf. For example, the fourth metal element source 14 may include $TiCl_4$.

In the third process SC3, the process S201 of supplying the third metal element source 13 may be performed for a time t05. For example, the time t05 may range from about 7 seconds to about 15 seconds. In the fourth process SC4, the process S203 of supplying the fourth metal element source 14 may be performed for a time t07. For example, the time t07 may range from about 3 seconds to about 7 seconds. In other words, the process S201 of supplying the third metal element source 13 may be longer than the process S203 of supplying the fourth metal element source 14. Each of the fifth to eighth purge processes P5, P6, P7 and P8 may be performed for a time of about 15 seconds to about 25 seconds. The third supplying process S202 of the oxygen source 16 may be performed for a time t06. For example, the time t06 may range from about 15 seconds to about 25 seconds. The fourth supplying process S204 of the oxygen source 16 may be performed for a time t08. For example, the time t08 may range from about 15 seconds to about 25 seconds. During the second cycle CL2 for forming the dielectric layer 30, a chamber temperature may be maintained at a temperature of about 300 degrees Celsius to about 500 degrees Celsius. During the second cycle CL2 for forming the dielectric layer 30, a pressure in the chamber may range from about 1 Torr (133 Pascal) to about 3 Torr (400 Pascal).

The formation of the dielectric layer 30 may be started at a start point ts2 of an initial second cycle CL2s and may be ended at an end point of the last second cycle. The initial second cycle CL2s including the start point ts2 may be started by the third process SC3 of the third and fourth processes SC3 and SC4. For example, in the initial second cycle CL2s including the start point ts2, an initially supplied metal element source may be the third metal element source 13. As a result, the second contact surface CS2 of the dielectric layer 30 described with reference to FIGS. 1 and 2 may be or correspond to the third layer L3. Alternatively, the initial second cycle CL2s including the start point ts2 may be started from the fourth process SC4 of the third and fourth processes SC3 and SC4. As a result, the second contact surface CS2 may be or correspond to the fourth layer L4.

After the formation of the dielectric layer 30 is completed, a second thermal treatment process (S500) may be performed. The second thermal treatment process (S500) may be performed in-situ in the deposition chamber 21. However, some example embodiments of inventive concepts are not limited thereto. The metal element sources may not be supplied during the second thermal treatment process (S500). The second thermal treatment process (S500) may be performed at a temperature of about 300 degrees Celsius to about 600 degrees Celsius. Alternatively, the second thermal treatment process (S500) may be omitted. Thereafter, a process of forming the upper electrode 50 may be performed.

Figure 12:
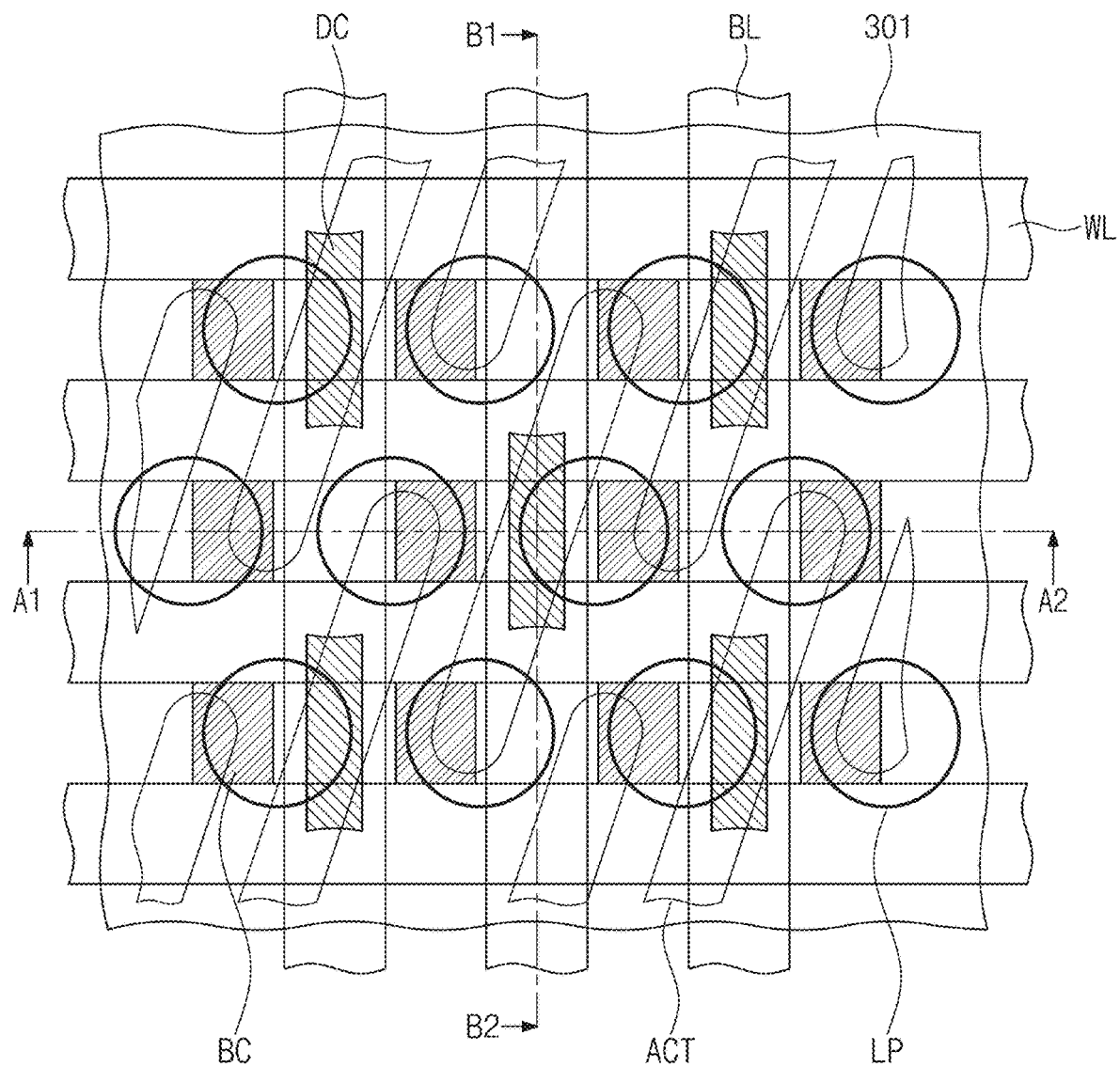
FIG. 12 is a plan view illustrating a semiconductor memory device including a capacitor according to some example embodiments of inventive concepts.

FIG. 12 is a plan view illustrating a semiconductor memory device including a capacitor according to some example embodiments of inventive concepts. FIGS. 13 to 19 are cross-sectional views taken along lines A1-A2 and B1-B2 of FIG. 12 to illustrate a method of manufacturing a semiconductor memory device including a capacitor, according to some example embodiments of inventive concepts.

In the following example embodiments, the capacitor used as a storage portion of a semiconductor memory device will be described as an example. However, the capacitor according to some example embodiments of inventive concepts is not limited to the storage portion of the semiconductor memory device but may be used as a non-memory element such as a decoupling structure.

Figure 13:
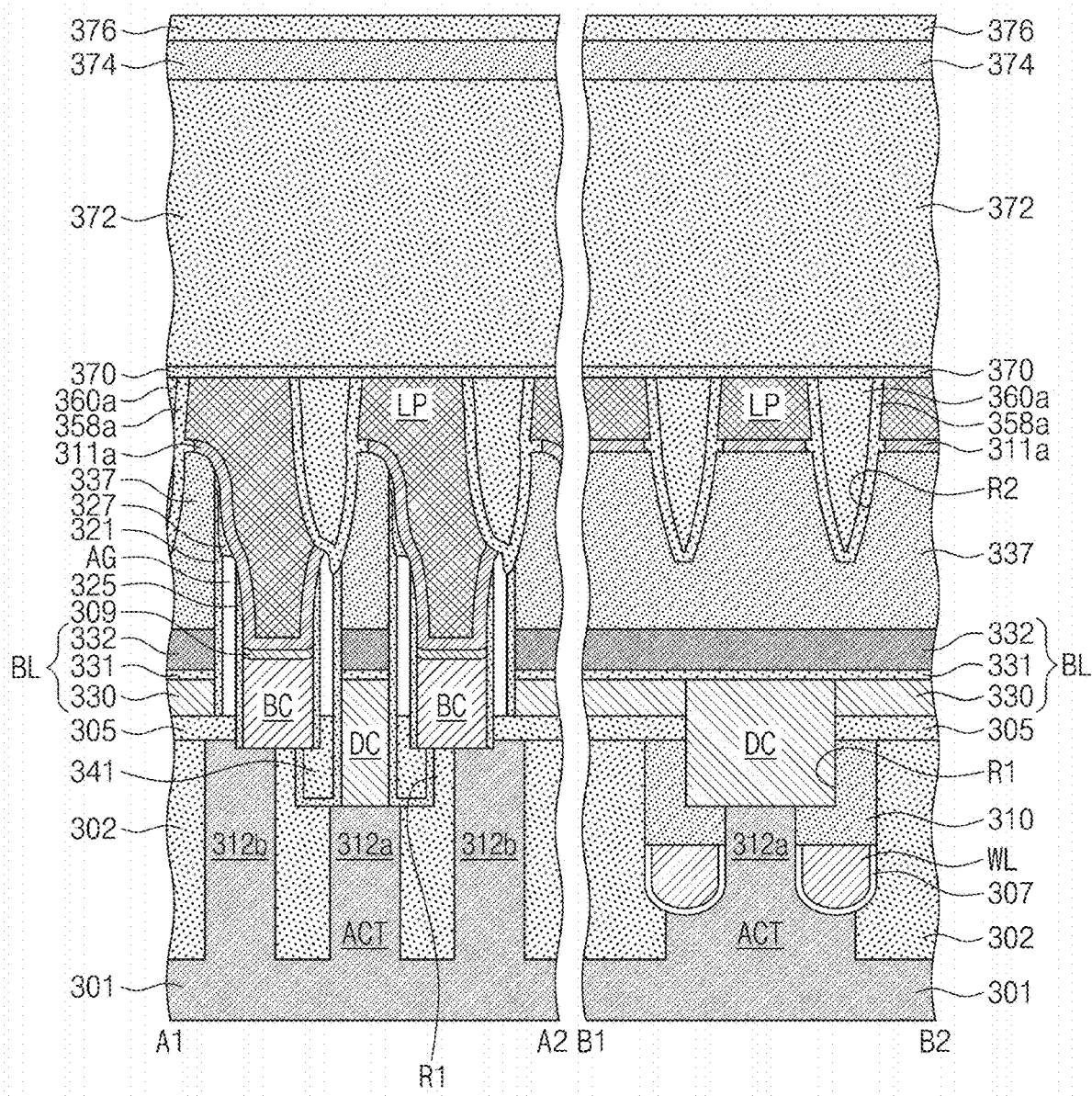
FIGS. 13 to 19 are cross-sectional views taken along lines A1-A2 and B1-B2 of FIG. 12 to illustrate a method of manufacturing a semiconductor memory device including a capacitor, according to some example embodiments of inventive concepts.

Referring to FIGS. 12 and 13, a device isolation pattern 302 may be disposed in a substrate 301 to define active portions ACT. The substrate 301 may be or include a semiconductor substrate, such as a single-crystal silicon wafer that has been lightly doped, e.g. lightly doped with boron. Each of the active portions ACT may have an isolated shape when viewed in a plan view. Each of the active portions ACT may have a bar shape extending in a third direction D3 when viewed in a plan view. Each of the active portions ACT may correspond to a portion of the substrate 301, which is surrounded by the device isolation pattern 302 when viewed in a plan view.

Word lines WL may intersect the active portions ACT. The word lines WL may be respectively disposed in grooves formed in the device isolation pattern 302 and the active portions ACT. The word lines WL may be parallel to a first direction D1 intersecting the third direction D3. The word lines WL may include a conductive material. A gate dielectric layer 307 may be disposed between the word line WL and an inner surface of the groove. The gate dielectric layer 307 may include at least one of a thermal oxide, silicon nitride, silicon oxynitride, or a high-k dielectric material.

A first dopant region 312a may be disposed in each of the active portions ACT between a pair of the word lines WL, and a pair of second dopant regions 312b may be disposed in both edge regions of each of the active portions ACT, respectively. The first and second dopant regions 312a and 312b may be doped with, for example, N-type dopants such as phosphorus and/or arsenic. The first dopant region 312a may correspond to a common drain region, and the second dopant regions 312b may correspond to source regions. Each of the word lines WL and the first and second dopant regions 312a and 312b adjacent thereto may constitute (e.g. correspond to) a transistor, and may act as, function as, or correspond to an access transistor for accessing a storage element of a DRAM cell; however, example embodiments are not limited thereto.

Top surfaces of the word lines WL may be lower than top surfaces of the active portions ACT. A word line capping pattern 310 may be disposed on each of the word lines WL. The word line capping patterns 310 may have line shapes extending in a longitudinal direction of the word lines WL and may cover the top surfaces of the word lines WL. The word line capping patterns 310 may include, for example, silicon nitride.

An interlayer insulating pattern 305 may be disposed on the substrate 301. The interlayer insulating pattern 305 may be formed of a single or multi-layer including at least one of a silicon oxide layer, a silicon nitride layer, or a silicon oxynitride layer.

Upper portions of the substrate 301, the device isolation pattern 302 and the word line capping pattern 310 may be partially recessed to form a first recess region R1. Bit lines BL may be disposed on the interlayer insulating pattern 305. The bit lines BL may intersect the word line capping patterns 310 and the word lines WL. As illustrated in FIG. 12, the bit lines BL may extend in a second direction D2 intersecting the first and third directions D1 and D3. Each of the bit lines BL may include a poly-silicon pattern 330, an ohmic pattern 331, and a metal-containing pattern 332, which are sequentially stacked. The poly-silicon pattern 330 may include poly-silicon doped or not doped with dopants. The ohmic pattern 331 may include a metal silicide. The metal-containing pattern 332 may include at least one of a metal (e.g., tungsten, titanium, and/or tantalum) or a conductive metal nitride (e.g., titanium nitride, tantalum nitride, and/or tungsten nitride). A bit line capping pattern 337 may be disposed on each of the bit lines BL. The bit line capping pattern 337 may include an insulating material such as silicon nitride. The bit line capping patterns 337 may include the same, or different materials from that of the word line capping patterns 310.

A bit line contact DC may be disposed in the first recess region R1 intersecting the bit line BL. The bit line contact DC may include poly-silicon doped or not doped with dopants, such as boron. The bit line contact DC may be electrically connected to the first dopant region 312a and may electrically connect the first dopant region 312a to the bit line BL.

A filling insulation pattern 341 may be disposed in the first recess region R1 in which the bit line contact DC is not disposed. The filling insulation pattern 341 may have a single-layered or multi-layered structure including at least one of a silicon oxide layer, a silicon nitride layer, or a silicon oxynitride layer.

Storage node contacts BC may be disposed between a pair of the bit lines BL adjacent to each other, as illustrated in FIG. 12. The storage node contacts BC may be spaced apart from each other. The storage node contacts BC may include poly-silicon doped (e.g. doped with boron) or not doped with dopants.

A bit line spacer including first and second spacers 321 and 325 spaced apart from each other by an air gap AG may be disposed between the bit line BL and the storage node contact BC. The first spacer 321 may cover a sidewall of the bit line BL and a sidewall of the bit line capping pattern 337. The second spacer 325 may be adjacent to the storage node contact BC. The first spacer 321 may extend to cover a sidewall of the bit line contact DC and a sidewall and a bottom surface of the first recess region R1. The first spacer 321 and the second spacer 325 may include the same material. For example, the first spacer 321 and the second spacer 325 may include silicon nitride. Alternatively, the air gap AG may not be provided, but a third spacer may be provided between the first spacer 321 and the second spacer 325.

A storage node ohmic layer 309 may be disposed on the storage node contact BC. The storage node ohmic layer 309 may include a metal silicide, such as tungsten silicide (WSi$_x$). A diffusion barrier pattern 311a may cover the storage node ohmic layer 309, the first and second spacers 321 and 325, and the bit line capping pattern 337. The diffusion barrier pattern 311a may include a metal nitride such as titanium nitride and/or tantalum nitride. A landing pad LP may be disposed on the diffusion barrier pattern 311a. The landing pad LP may include a metal-containing material such as tungsten. An upper portion of the landing pad LP may cover a top surface of the bit line capping pattern 337 and may have a width greater than that of the storage node contact BC. A center of the landing pad LP may be shifted from a center of the storage node contact BC in the first direction D1, as illustrated in FIG. 12. One upper sidewall of the bit line capping pattern 337 may overlap with the landing pad LP and may be covered with a third spacer 327. A second recess region R2 may be formed at another upper sidewall of the bit line capping pattern 337.

A first capping pattern 358a may be provided between adjacent landing pads LP. The first capping pattern 358a may have a liner shape, and a space surrounded thereby may be filled with a second capping pattern 360a. Each of the first and second capping patterns 358a and 360a may include a silicon nitride layer, a silicon oxide layer, a silicon oxynitride layer, and/or a porous layer. The first capping pattern 358a and the second capping pattern 360a may fill the second recess region R2.

An etch stop layer 370 may be formed on the landing pads LP, the first capping pattern 358a and the second capping pattern 360a. A first mold layer 372, a support layer 374 and a second mold layer 376 may be formed on the etch stop layer 370. For example, each of the etch stop layer 370 and the support layer 374 may be formed of a silicon nitride layer. Each of the first and second mold layers 372 and 376 may be formed of a material having an etch selectivity with respect to the support layer 374. For example, each of the first and second mold layers 372 and 376 may be formed of a silicon oxide layer.

Figure 14:
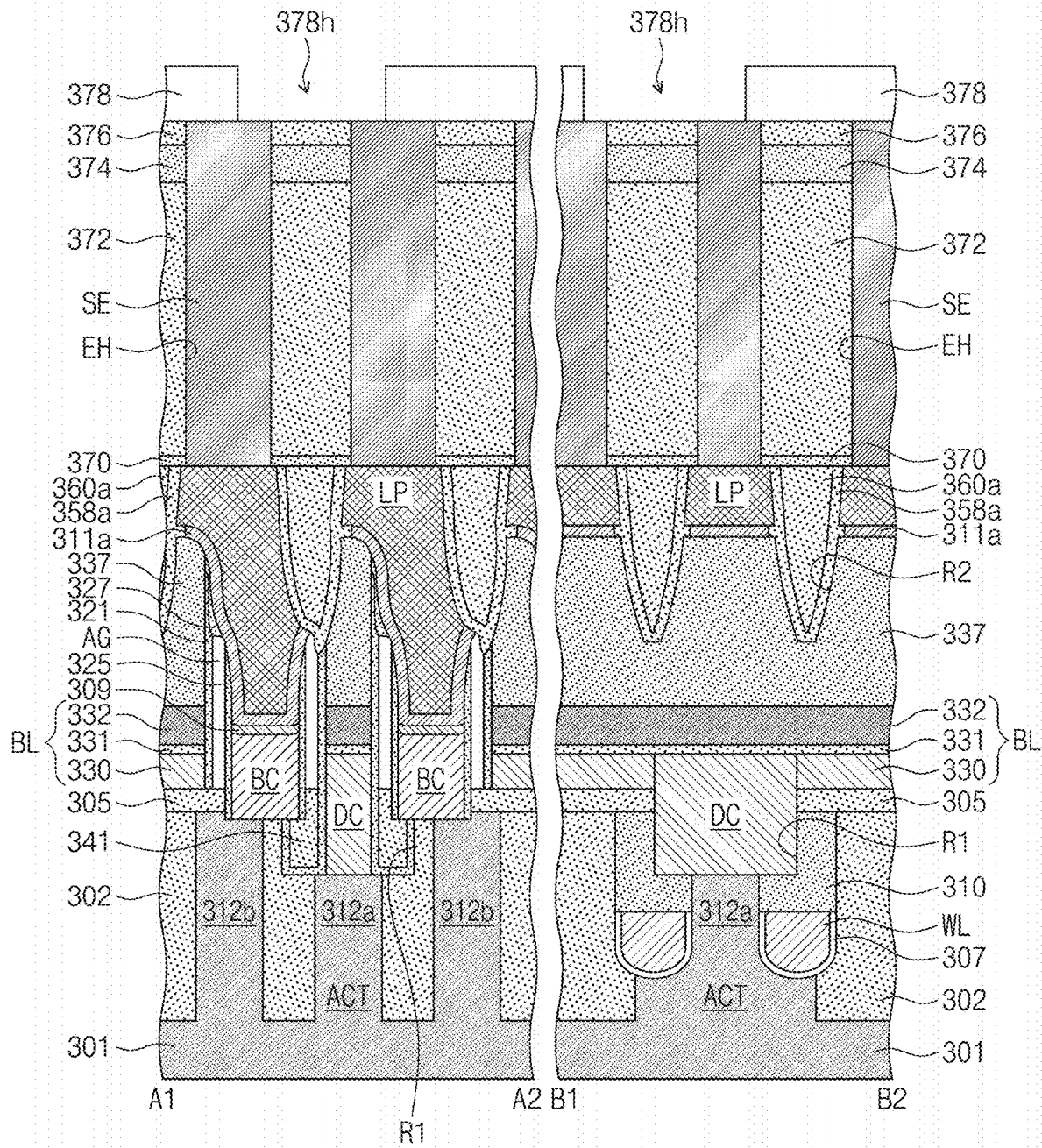

Referring to FIGS. 12 and 14, the second mold layer 376, the support layer 374, the first mold layer 372 and the etch stop layer 370 may be sequentially patterned to form electrode holes EH exposing the landing pads LP, respectively. A conductive layer may be formed to fill the electrode holes EH, and an etch-back process and/or a chemical mechanical polishing (CMP) process may be performed on the conductive layer to remove the conductive layer disposed on the second mold layer 376 and to form base electrodes SE in the electrode holes EH, respectively. The base electrode SE may include a metal nitride. For example, the base electrode SE may have a single-layered or multi-layered structure including at least one of TiN, WN, TaN, HfN, ZrN, TiAlN, TaSiN, TiSiN, TaAlN, TiBN, TiON, TiAlON, TiCN, TiAlCN, or TiSiCN.

A third mask pattern 378 may be formed on the second mold layer 376. The third mask pattern 378 may have a plurality of openings 378h. Each of the openings 378h may expose top surfaces of the base electrodes SE adjacent to each other and the second mold layer 376 between the base electrodes SE.

Figure 15:
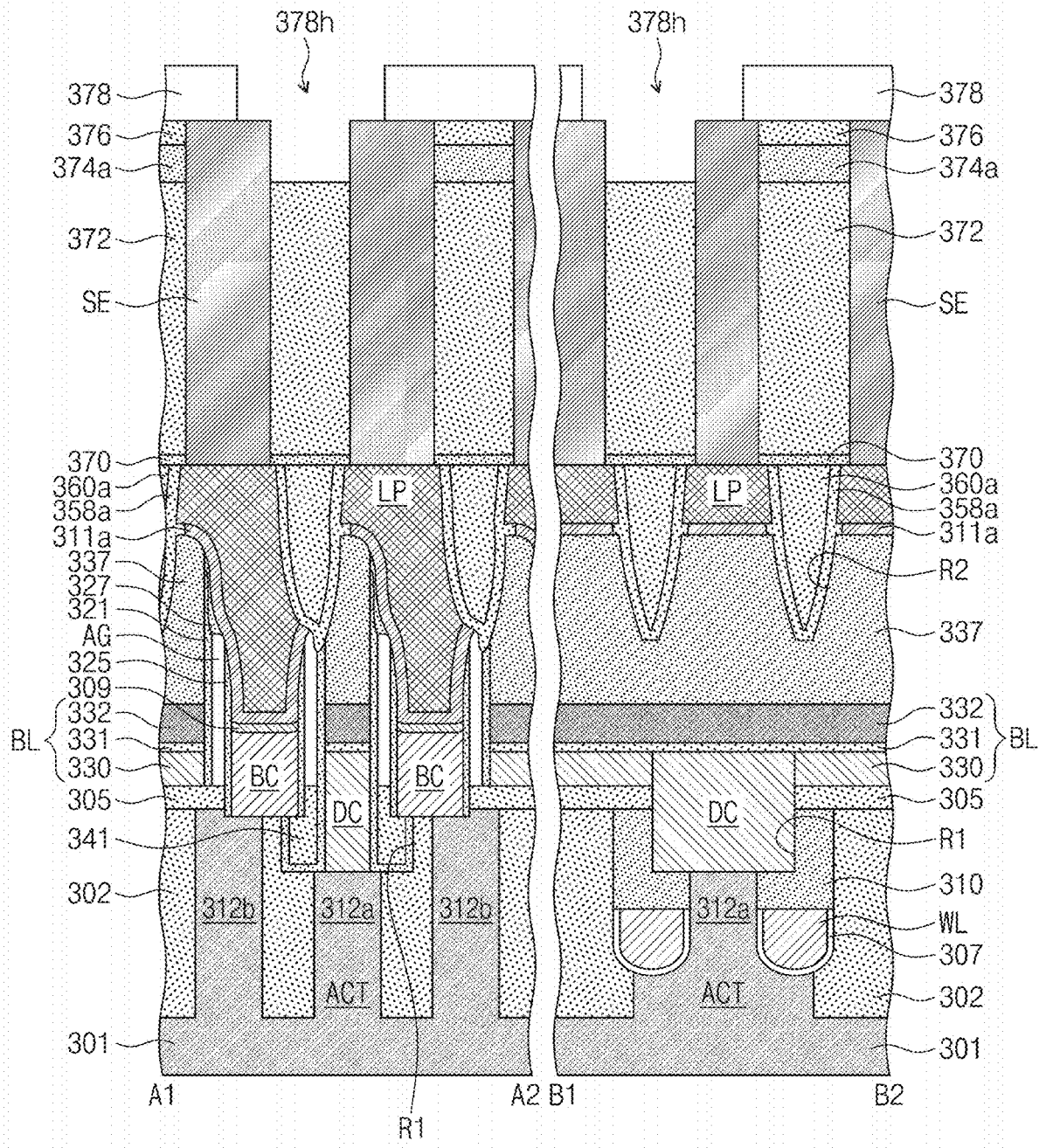

Referring to FIGS. 12 and 15, an anisotropic etching process (such as a dry etching process) may be performed using the third mask pattern 378 as an etch mask to remove the second mold layer 376 exposed by the opening 378h and the support layer 374 thereunder. Thus, a support pattern 374a may be formed, and the first mold layer 372 under the opening 378h may be exposed.

Figure 16:
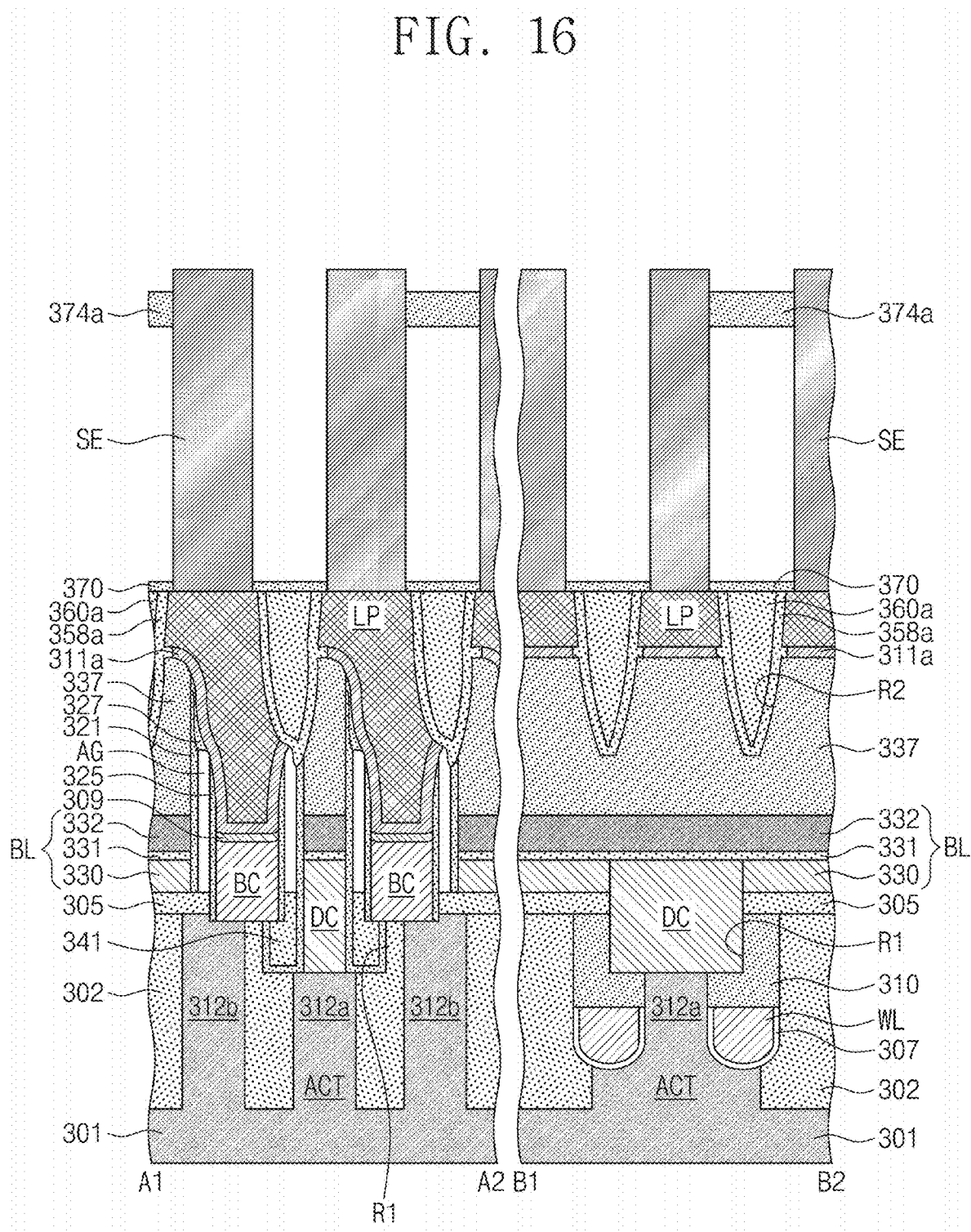

Referring to FIGS. 12 and 16, the third mask pattern 378 may be removed to expose the second mold layer 376. The first and second mold layers 372 and 376 may be removed by an isotropic etching process to expose surfaces of the base electrode SE, the support pattern 374a and the etch stop layer 370.

Figure 17:
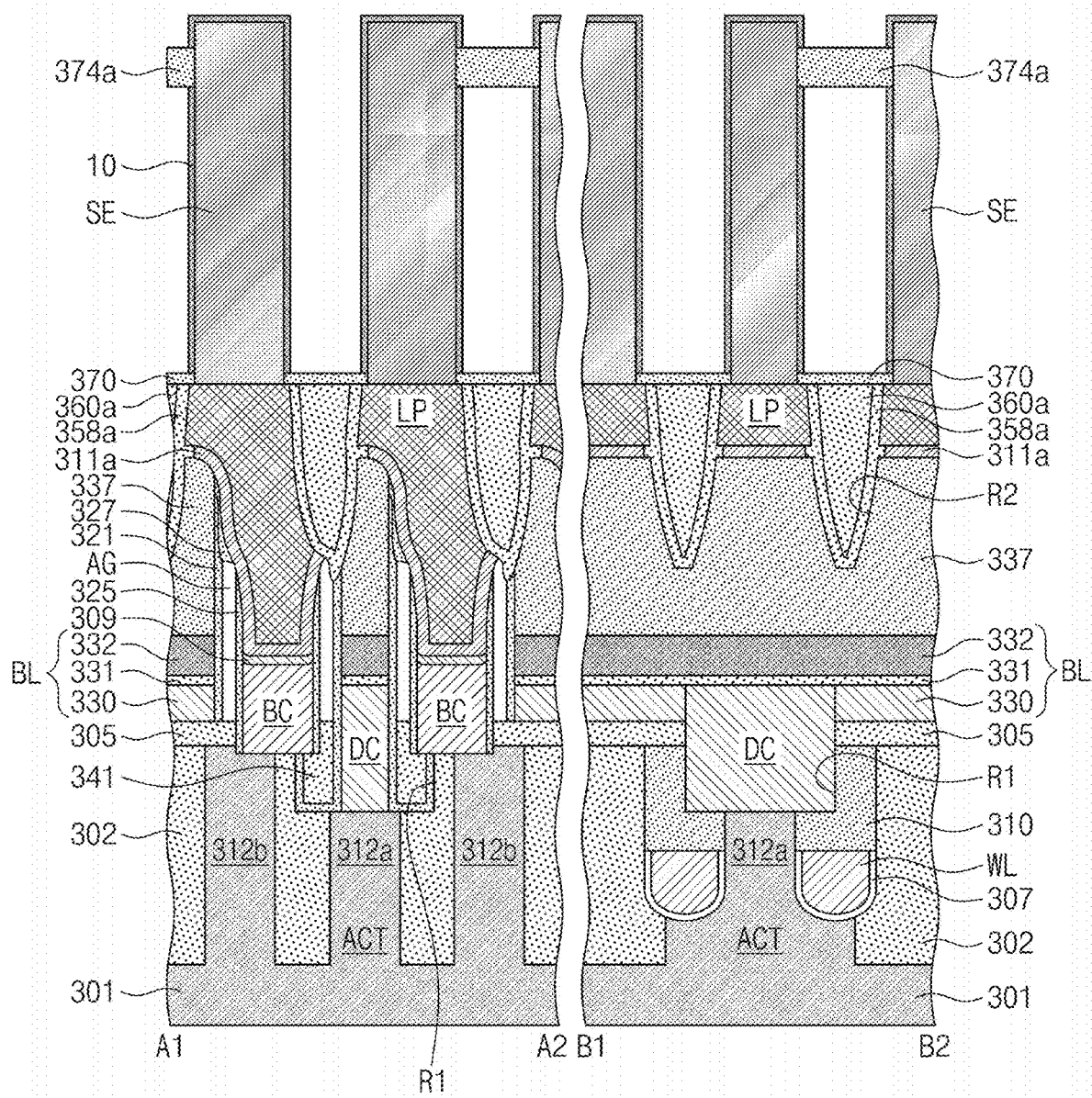

Referring to FIGS. 12 and 17, lower electrodes 10 may be formed on exposed surfaces of the base electrodes SE. The lower electrodes 10 on the base electrodes SE may be separated from each other. For example, the process of forming the lower electrodes 10 may include a process of removing portions deposited between the base electrodes SE to expose the etch stop layer 370. The lower electrodes 10 may cover sidewalls and top surfaces of the base electrodes SE. The lower electrodes 10 may be substantially the same as the lower electrode 10 described with reference to FIGS. 1 to 11 and may be formed by substantially the same method as the lower electrode 10 of FIGS. 1 to 11. Referring to FIG. 17, the lower electrode 10 may be conformal to a shape of the base electrode SE; for example, the lower electrode 10 may be deposited in a manner to follow the shape of the base electrode SE.

Figure 18:
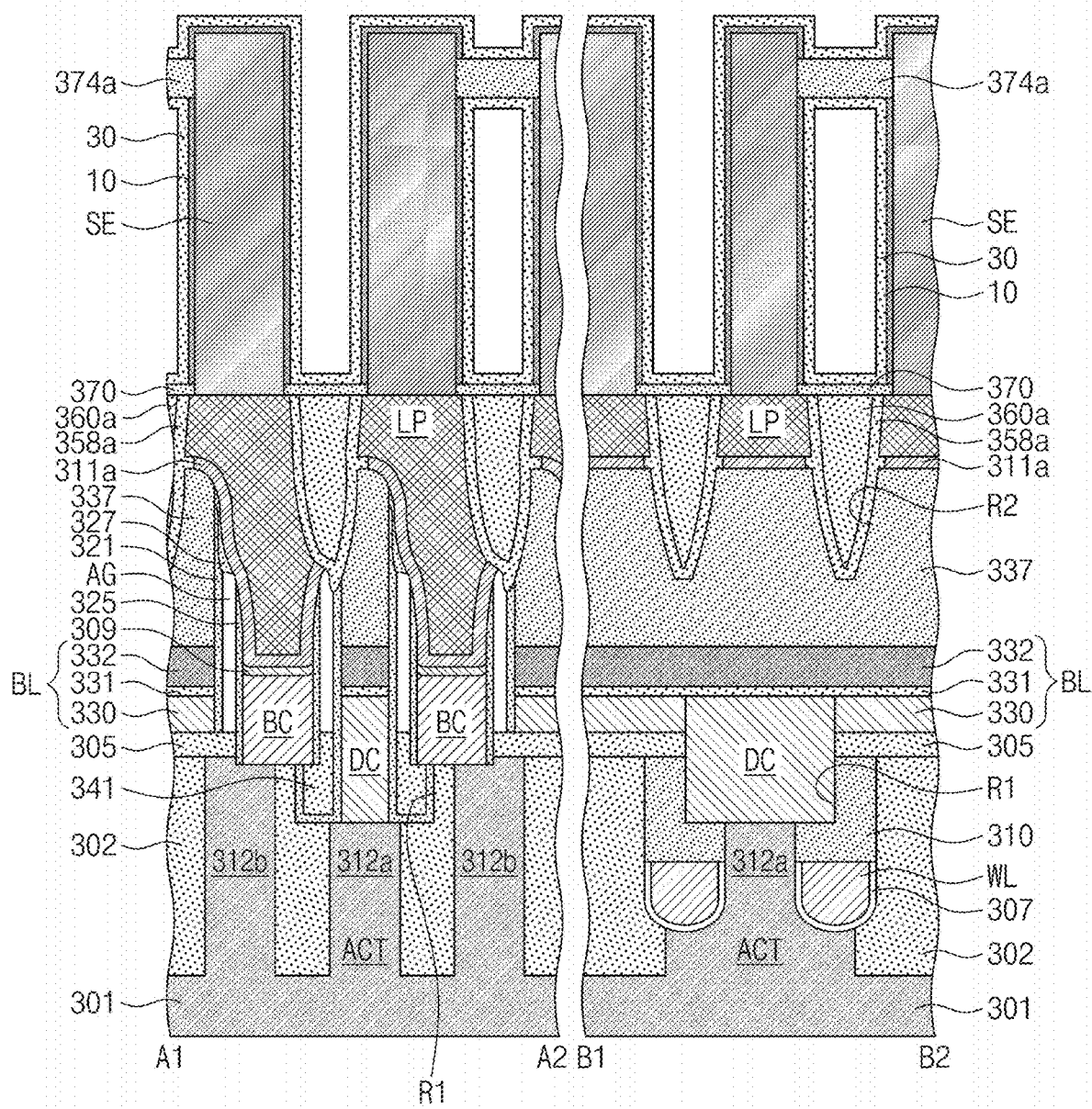

Referring to FIGS. 12 and 18, a dielectric layer 30 may be formed to cover the lower electrodes 10. The dielectric layer 30 may cover a plurality of the lower electrodes 10 in common. The dielectric layer 30 may be substantially the same as the dielectric layer 30 described with reference to FIGS. 1 to 11 and may be formed by substantially the same method as the dielectric layer 30 of FIGS. 1 to 11. Referring to FIG. 16, the dielectric layer 30 may be conformal to a shape of the lower electrode 10; for example, the dielectric layer 30 may be deposited in a manner to follow the shape of the lower electrode 10.

Figure 19:
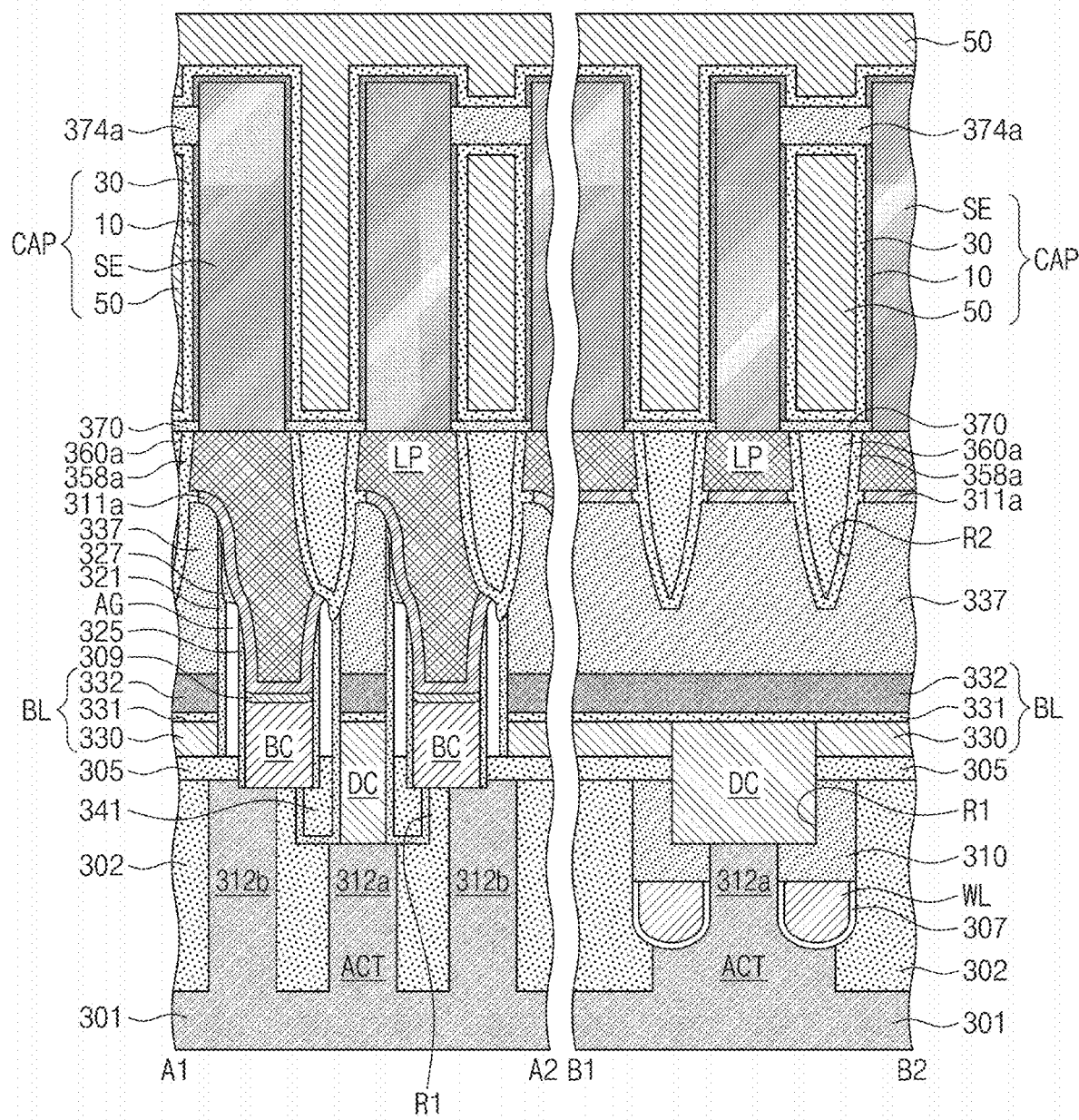

Referring to FIGS. 12 and 19, an upper electrode 50 may be formed on the dielectric layer 30. The upper electrode 50 may be substantially the same as the upper electrode 50 described with reference to FIGS. 1 to 11 and may be formed by substantially the same method as the upper electrode 50 of FIGS. 1 to 11. Referring to FIG. 19, the upper electrode may be conformal to a shape of the dielectric 30 and/or may entirely fill the openings. A semiconductor memory device having a capacitor CAP including the base electrode SE, the lower electrode 10, the dielectric layer 30 and the upper electrode 50 may be formed by the formation of the upper electrode 50. Other processes (not illustrated) may include planarization of the top surfaces of the upper electrode 50, e.g. planarization by etch-back and/or CMP processes. The capacitor CAP may act as, function as, or correspond to a storage element for a DRAM cell; however, example embodiments are not limited thereto.

According to the some example embodiments of inventive concepts, the contact surface of the lower electrode, which is in contact with the dielectric layer, may be controlled to reduce a leakage current of the semiconductor device and to improve the reliability of the semiconductor device.

While inventive concepts have been described with reference to example embodiments, it will be apparent to those of ordinary skill in the art that various changes and modifications may be made without departing from the spirits and scopes of the inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:

1. A semiconductor device comprising:
   a substrate; and
   a capacitor on the substrate, the capacitor including a lower electrode, a dielectric layer, and an upper electrode sequentially stacked on the substrate,
   wherein the lower electrode includes $ABO_3$ where 'A' is a first metal element and 'B' is a second metal element having a work function greater than that of the first metal element;
   the dielectric layer includes $CDO_3$ where 'C' is a third metal element and 'D' is a fourth metal element;
   the lower electrode includes a first layer and a second layer which are alternately and repeatedly stacked;
   the first layer includes the first metal element and oxygen;
   the second layer includes the second metal element and oxygen; and
   the dielectric layer is in contact with the lower electrode at a first contact surface, the first contact surface corresponding to the second layer.

2. The semiconductor device of claim 1, wherein the first contact surface has a {100} crystal plane.

3. The semiconductor device of claim 1, wherein each of the lower electrode and the dielectric layer have a perovskite crystal structure.

4. The semiconductor device of claim 1, wherein the dielectric layer includes a third layer and a fourth layer which are alternately and repeatedly stacked;
   the third layer includes the third metal element and oxygen;

the fourth layer includes the fourth metal element and oxygen; and the dielectric layer is in contact with the lower electrode at a second contact surface, the second contact surface corresponding to the third layer.

5. The semiconductor device of claim 4, wherein a work function of the fourth metal element is greater than a work function of the third metal element.

6. The semiconductor device of claim 1, wherein the work function of the second metal element is greater than a work function of the fourth metal element.

7. The semiconductor device of claim 1, wherein the work function of the second metal element is greater than 4.5 eV and less than 6 eV.

8. The semiconductor device of claim 1, wherein the first metal element is at least one of Sr, Ba, La, or Ca.

9. The semiconductor device of claim 1, wherein the second metal element is at least one of Ru, Mo, Ir, Co, or Ni.

10. The semiconductor device of claim 1, wherein the third metal element is at least one of Ba, Sr, or Ca.

11. The semiconductor device of claim 1, wherein the fourth metal element is at least one of Ti, Zr, or Hf.

12. The semiconductor device of claim 1, wherein a thickness of the lower electrode is between 50 Å to 100 Å.

13. The semiconductor device of claim 1, wherein
the capacitor further comprises a base electrode; and
the lower electrode covers a sidewall of the base electrode and a top surface of the base electrode.

14. The semiconductor device of claim 1, wherein within a hole of the semiconductor device, the upper electrode entirely fills the hole.

15. A semiconductor device comprising:
a substrate; and
a capacitor on the substrate, the capacitor including a lower electrode, a dielectric layer, and an upper electrode sequentially stacked on the substrate,
wherein a top surface of the lower electrode contacts a bottom surface of the dielectric layer;
the lower electrode includes a first metal element, a second metal element, and oxygen;
the dielectric layer includes a third metal element, a fourth metal element, and oxygen,
the lower electrode includes a first layer and a second layer which are alternately and repeatedly stacked;
the first layer includes the first metal element and oxygen, and the second layer includes the second metal element and oxygen;
the first metal element is at least one of Sr, Ba, La, or Ca, and the second metal element is at least one of Ru, Mo, Ir, Co, or Ni; and
the dielectric layer contacts the lower electrode at a first contact surface, the first contact surface corresponding to the second layer.

16. The semiconductor device of claim 15, wherein
the dielectric layer includes a third layer and a fourth layer which are alternately and repeatedly stacked;
the third layer includes the third metal element and oxygen;
the fourth layer includes the fourth metal element and oxygen; and
the dielectric layer contacts the lower electrode at a second contact surface, the second contact surface corresponding to one of the third layer or the fourth layer, the one of the third layer or the fourth layer having a smaller work function than the other of the third layer or the fourth layer.

17. The semiconductor device of claim 15, wherein
the third metal element is at least one of Ba, Sr, or Ca; and
the fourth metal element is at least one of Ti, Zr, or Hf.

18. The semiconductor device of claim 15, wherein
the capacitor further comprises a base electrode; and
the lower electrode covers a sidewall of the base electrode and a top surface of the base electrode.

* * * * *